(12) United States Patent
Inoue et al.

(10) Patent No.: US 7,459,708 B2
(45) Date of Patent: Dec. 2, 2008

(54) EXTREME UV RADIATION SOURCE DEVICE AND METHOD FOR ELIMINATING DEBRIS WHICH FORMS WITHIN THE DEVICE

(75) Inventors: Masaki Inoue, Himeji (JP); Hironobu Yabuta, Himeji (JP); Taku Sumitomo, Himeji (JP); Kyohei Seki, Himeji (JP); Masaki Yoshioka, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 210 days.

(21) Appl. No.: 11/337,539

(22) Filed: Jan. 24, 2006

(65) Prior Publication Data
US 2006/0163500 A1 Jul. 27, 2006

(30) Foreign Application Priority Data
Jan. 24, 2005 (JP) ............................. 2005-015182

(51) Int. Cl.
*H01J 7/24* (2006.01)
*G03F 7/20* (2006.01)
(52) U.S. Cl. ................................................. 250/504 R
(58) Field of Classification Search ........................ None
See application file for complete search history.

(56) References Cited

U.S. PATENT DOCUMENTS

| 5,612,588 | A | 3/1997 | Wakalopulos | |
|---|---|---|---|---|
| 6,359,969 | B1 | 3/2002 | Shmaenok | |
| 6,894,298 | B2 | 5/2005 | Ahmad et al. | |
| 2003/0190012 | A1 | 10/2003 | Ahmad | |
| 2004/0183038 | A1* | 9/2004 | Hiramoto et al. | 250/504 R |
| 2006/0072084 | A1* | 4/2006 | Van Herpen et al. | 355/30 |
| 2006/0131515 | A1* | 6/2006 | Partlo et al. | 250/504 R |
| 2006/0175558 | A1* | 8/2006 | Bakker et al. | 250/492.2 |
| 2007/0018119 | A1* | 1/2007 | Yabuta et al. | 250/493.1 |

FOREIGN PATENT DOCUMENTS

EP 1429189 A1 * 6/2004
WO WO 2004/092693 A2 10/2004

* cited by examiner

*Primary Examiner*—Jack I Berman
(74) *Attorney, Agent, or Firm*—David S. Safran

(57) ABSTRACT

To suppress the adherence of debris as a result of a radiating fuel, such as tin or the like, within a vessel for forming high density and high temperature plasma of an extreme UV radiation source device, and to eliminate deposited tin and/or tin compounds with high efficiency, hydrogen radical producing parts are provided in the vessel; and hydrogen radicals are produced in the vessel so that deposition of tin and/or a tin compound is suppressed in the area with a low temperature of the device, such as a focusing mirror or the like, and the deposited tin and/or tin compound is eliminated.

3 Claims, 20 Drawing Sheets

Fig. 12 (a)
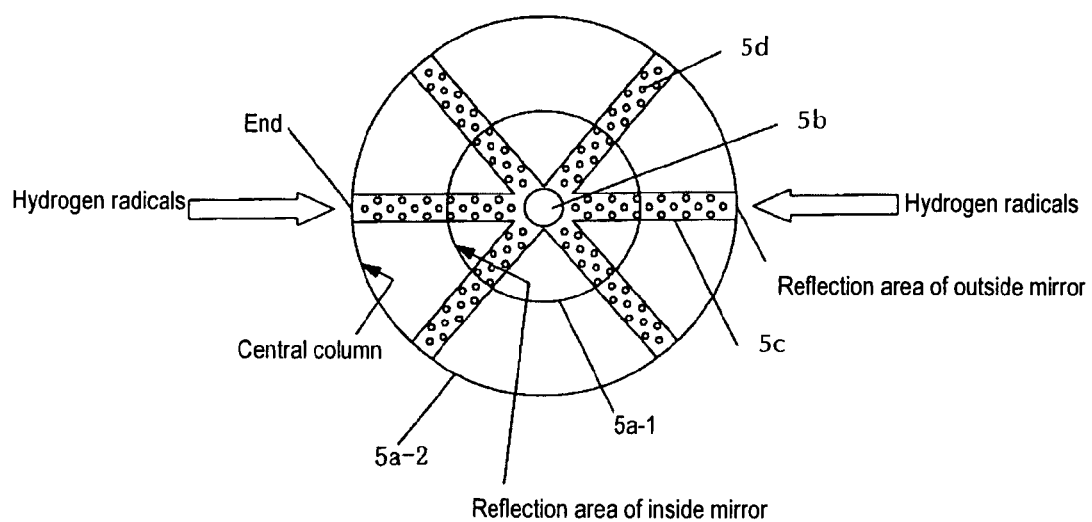
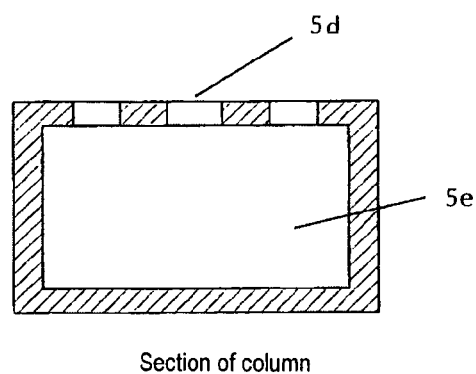
Section of column
Fig. 12 (b)

EXTREME UV RADIATION SOURCE DEVICE AND METHOD FOR ELIMINATING DEBRIS WHICH FORMS WITHIN THE DEVICE

BACKGROUND OF THE INVENTION

1. Field of the Invention

The invention relates to an extreme UV radiation source device which emits extreme UV radiation, and a process for eliminating debris which forms in an extreme UV radiation source device. The invention relates especially to an extreme UV radiation source device in which the effort is made to prolong its service life by introducing hydrogen radicals, and a process for eliminating contaminations.

2. Description of the Prior Art

According to the miniaturization and increased integration of an integrated semiconductor circuit, an increase of resolution is required in a projection exposure tool when it is being manufactured. To meet this requirement, the wavelengths of the exposure light source are being increasingly shortened. An extreme UV radiation source device (EUV radiation source device) which emits extreme UV radiation (hereinafter also called EUV (extreme ultraviolet) radiation) with wavelengths from 13 nm to 14 nm, especially with a wavelength of 13.5 nm, was developed as a semiconductor exposure light source of the next generation in succession to an excimer laser device.

A few schemes are known for producing EUV radiation in a EUV radiation source device. In one, a high density and high temperature plasma is produced by heating or excitation of a EUV radiating fuel and EUV radiation is extracted from this plasma.

The EUV radiation source device adopting such a scheme based on the method of production of a high density and high temperature plasma is roughly divided into an EUV radiation source device of the LPP (laser produced plasma) type and an EUV radiation source device of the DPP (discharge produced plasma) type (for example, "Current situation and future prospect of research of an EUV (extreme UV) light source for lithography" in J. Plasma Fusion Res. March 2003, Vol. 79, no. 3, pp. 219-260).

In an EUV radiation source device of the LPP type, EUV radiation is used from a high density and high temperature plasma which is formed from irradiated targets such as solids, liquid, gas and the like with a pulsed laser.

On the other hand, in an EUV radiation source device of the DPP type, EUV radiation from a high density and high temperature plasma which has been produced by power current driving is used. Discharge methods in an EUV radiation source of the DPP type, as described in the aforementioned publication, include a Z pinch method, a capillary discharge method, a dense plasma focus method, a hollow cathode triggered Z pinch method and the like.

The EUV radiation source device of the DPP type, as compared to the EUV radiation source device of the LPP type, has the advantages of a small radiation source device and low power consumption of the radiation source system. Practical use in the market is strongly expected.

In the above described EUV radiation source devices of the two types, it is imagined that, currently, roughly decavalent Xe (xenon) ions and Sn (tin) ions are very promising as the radiating fuel which emits EUV radiation with a wavelength of 13.5 nm from a high density and high temperature plasma. Here, tin has a several times higher conversion efficiency than that of xenon. Conversion efficiency is defined as the ratio of the radiation intensity of the EUV radiation with a wavelength of 13.5 nm to the input energy for producing high density and high temperature plasma. Therefore, tin is being noticed as an EUV radiating fuel.

Tin has a melting point of roughly 230° C. The vapor pressure of tin is, however, low. Tin has the property that it does not adequately vaporize before exceeding 2000° C. Therefore, conventionally, tin is supplied to the plasma production area by vaporization of tin by laser irradiation, by self-heating of a tin supply source by a discharge and by similar methods. However, tin, as described above, has a low vapor pressure and is solid at room temperature. Accordingly, when a high density and high temperature plasma is being produced by heating or excitation, there is the disadvantage that a large amount of debris is formed as a result of the tin. Furthermore, tin which has a low vapor pressure deposits in a region with a low temperature within the device when it returns from the plasma state to the normal gaseous state. This degrades the performance of the device.

In an EUV radiation source device, generally, EUV radiation which is emitted by a high density and high temperature plasma is focused once by means of a focusing mirror which is located in the vicinity of the plasma, and afterwards, it is emitted to a subsequent stage. This focusing mirror corresponds, for example, to the above described area with a low temperature within the device. In the case, in which tin and/or a tin compound deposits on the focusing mirror, the reflectivity of the focusing mirror with respect to EUV radiation with a wavelength of 13.5 nm is degraded. As a result, the intensity of the EUV radiation emitted to a subsequent stage decreases. Compare in this respect Japanese Patent Application JP 2004-279246 A (U.S. Patent Application Publication 2004/0183038 A1), Japanese Patent Application JP 2002-504746 A (U.S. Pat. No. 6,359,969 B1), U.S. Patent Application Publication 2003/0190012 A1, International Patent Application Publication WO 2004/092693 A2, Japanese Patent Application JP HEI 10-512092 A (U.S. Pat. No. 5,612,588 A), Japanese Patent Application JP 2003-218025 A (U.S. Pat. No. 6,894,298 B2) and Akira Kanabara, *Sputtering Phenomenon*, Tokyo University Press, 1984, page 112-117.

As was described above, tin has a several times higher efficiency than that of xenon. It is therefore very promising as an EUV radiating fuel. In tin which has a low vapor pressure and which is solid at normal temperature, in contrast to xenon which is in the gaseous state at a normal temperature and which does not lead to debris, when a high density and high temperature plasma is produced by heating or excitation, a large amount of debris is formed as a result of tin.

Generally, in an EUV radiation source device, between the high density and high temperature plasma and the focusing mirror there is a debris trap which is used to capture debris and to pass only EUV radiation. The debris trap, as described, for example, in Japanese Patent Application JP 2002-504746 A (U.S. Pat. No. 6,359,969 B1), consists of several plates which are arranged in the radial direction of the producing area for plasma with a high temperature and high density. This debris trap captures debris such as metal powder or the like which is formed by sputtering of a metal which is caused in contact with a high density and high temperature plasma, by which the above described plasma is produced, debris as a result of a radiating fuel such as tin or the like, and the like. (The above described metal which is in contact with a high density and high temperature plasma for example in the case of an EUV radiation source device of the LPP type can be defined as a nozzle for supply of the EUV radiating fuel to the plasma producing area and in the case of an EUV radiation source device of the DPP type, a discharge electrode of tungsten or the like).

There is still debris which passes through the debris trap. In particular, most debris as a result of a radiating fuel, such as tin or the like, has a lower weight than the debris of a metallic powder, particles (especially tungsten) or the like ($SnH_4$=122.73, W=183.86) and due to its less linear propagation momentum, it easily passes through the debris trap. This means that the debris of a metallic powder or the like which originates from the vicinity of the light source continues moving after formation with a uniform speed in a certain direction. Therefore, the debris trap which has been formed accordingly is effective for trapping debris of a metallic powder, particles or the like.

On the other hand, debris as a result of a radiating fuel such as tin or the like is in the atomic gaseous state. Since its path is complicated, it often passes through the debris trap. The debris as a result of a radiating fuel, such as tin or the like, which has passed through the debris trap deposits, for example, in the EUV focusing mirror and causes a reduction of the EUV radiation reflection factor of the focusing mirror.

In order to eliminate this disadvantage, in Japanese Patent Application JP 2004-279246 A (U.S. Patent Application Publication 2004/0183038 A1), a process for supplying $SnH_4$ to the plasma producing area was proposed.

The following was named as the advantage of this process:

In contrast to a process in which at room temperature tin as a solid is caused to vaporize, heating to a high temperature is not required.

$SnH_4$ as a gas is easily transported to the heating or excitation space (production space for high density and high temperature plasma) which constitutes the plasma producing area.

Control of the tin concentration is easily carried out by mixing with a rare gas.

In contrast to tin as a solid, $SnH_4$ is normally in the gaseous state. After plasma formation in the producing space for a high density and high temperature plasma, it is therefore easily released in the atomic gaseous state. It hardly agglomerates in the area with a low temperature within the device and hardly deposits.

As a result of the vigorous research and experiments of the inventors, it was found that even by supplying $SnH_4$ as the radiating fuel supply material to the producing area for a high density and high temperature plasma within the EUV radiation source device, deposition of tin and/or a tin compound (for example, a carbide, oxide, or the like) in the area with a low temperature within the EUV radiation source device cannot be completely eliminated.

Tin which has formed from the portion of the $SnH_4$ which does not contribute to plasma formation and/or from the plasma, $SnH_4$ which was formed by a recombination of fragments such as SnH, $SnH_2$, $SnH_3$ (hereinafter $SnH_x$), and fragments of $SnH_x$ with a high vapor pressure are released maintaining the gaseous condition by an evacuation means which is spatially connected to the plasma producing area of the EUV radiation source device. However, the following was found.

As a result of plasma formation, metallic clusters such as Sn, $Sn_x$ (aggregate of atoms and molecules) of the atomic gas produced by decomposition and a portion of the fragments such as $SnH_x$ or the like come into contact with the area of low temperature of the device, by which tin and/or tin compounds deposit. For example, $SnH_4$ decomposes on a metallic surface at roughly 150° C., by which a tin film is formed. The term "Sn-compound" for purposes of the present invention is defined, for example, as a carbide, oxide or the like of tin.

It goes without saying that these disadvantages arise in the process for supplying tin as the EUV radiating fuel not only in the case of introducing $SnH_4$ into the plasma producing area, but also in the case of use of another tin hydride with a high vapor pressure, such as $Sn_2H_6$ or the like.

In Japanese Patent Application JP 2004-279246 A (U.S. Patent Application Publication 2004/0183038 A1), it is described that hydrogen ($H_2$) gas is introduced in the direction which is linked to the outlet flow which contains debris as a result of a radiating fuel, such as tin or the like, this outlet flow being produced by evacuation operation of the above described evacuation means and being allowed to flow out of the producing space for high temperature and high density plasma. In this way hydrogen ($H_2$) gas can be reacted with vaporous tin, tin hydride with a high vapor pressure is produced, and it is evacuated without deposition within the device.

By using such a process, the effect of debris as a result of a radiating fuel, such as tin or the like, is reduced even more. However, as was described above, the tin layer which has deposited in the area with the low temperature of the device cannot be eliminated by simple introduction of hydrogen ($H_2$) gas. Therefore, if tin and/or a tin compound has deposited on the focusing mirror, the disadvantage of a reduction of the reflectivity of the focusing mirror with respect to the EUV radiation with a wavelength of 13.5 nm and a degradation of the efficiency of the device remain as before.

SUMMARY OF THE INVENTION

The invention was devised to eliminate the above described disadvantages in the prior art. Thus, a primary object of the invention is to devise an extreme UV radiation source device in which debris as a result of the radiating fuel, such as tin or the like, is stopped from depositing and the reduction of the performance of the device is restrained, and in which, moreover, even when the above described debris in the form of tin and/or a tin compound deposits within the EUV radiation source device, the deposited material can be eliminated with high efficiency. An object of the invention is furthermore to devise a process for eliminating the above described debris.

The inventors have vigorously studied two measures which are described below for reducing the effect of debris as a result of a radiating fuel, such as tin or the like. As a result, they found that the effect of the above described debris can be effectively and drastically reduced by the debris as a result of the radiating fuel, such as tin or the like, being reacted with hydrogen radicals, thus tin hydride with a high vapor pressure is produced and the produced tin hydride is evacuated.

When producing EUV radiation by producing high density and high temperature plasma, in the case of supplying tin as the radiating fuel by vaporization by laser irradiation and by heating by a discharge to the producing area for high density and high temperature plasma, metallic clusters such as Sn, $Sn_x$ are formed from the atomic gas after plasma generation, as was described above. In the case of supplying SnH4 as the radiating fuel supply material, in addition to the above described substance, fragments (tin hydride such as $SnH_x$) are formed.

Furthermore, tin compounds are formed by a gaseous phase reaction of atomic Sn, $Sn_x$, or $SnH_x$ with a trace of water ($H_2O$), hydrocarbon and the like which remain within the device, so that tin and/or a tin compound (for example, carbide, oxide or the like) deposit as debris in the area with the low temperature of the device, such as in the focusing mirror or the like. Therefore, as a measure for reducing the effect of this debris, the following measures were examined.

The term "cluster" is defined here as an deposition of a few to a few thousand atoms which, moreover, do not show any general property as a material. For example, clusters of here tin are an deposition of a few to a few thousand tin atoms. However, they do not exhibit any general material property like tin. On the other hand, the term "fragment" is defined as unstable molecules and atoms which have been produced by decomposition of stable molecules. This term also includes, for example, SnH, $SnH_2$ and the like which have been produced by decomposition of $SnH_4$.

(Measure 1)

Sn, metallic clusters, such as $Sn_x$ and $SnH_x$ fragments (Sn fragments), which are in the gaseous phase state and are produced after plasma production, and hydrogen are reacted with one another in the gaseous state, gaseous tin hydride with a high vapor pressure, especially more stable (less depositing) $SnH_4$ is formed and evacuated by an evacuation means which is located in the EUV radiation source device.

(Measure 2)

Tin and/or a tin compound which deposit as debris in the area with a low temperature of the device, such as in the focusing mirror or the like, and which have deposited in this area with the low temperature of the device, are reacted with hydrogen, gaseous tin hydride with a high vapor pressure, especially more stable (less depositing) $SnH_4$ is formed and the above described debris is eliminated by evacuation, for example, by means of an evacuation means which is located in the EUV radiation source device.

Gaseous tin hydride with a high vapor pressure is formed specifically by the debris being reacted with hydrogen during the presence of the debris as a result of a radiating fuel, such as tin or the like, in the gaseous phase state in space, or in the case of contact of debris with the low temperature area of the device and its deposition as tin and/or a tin compound, by the above described deposition also being reacted with hydrogen, and thus, the above described debris is eliminated.

This measure makes it possible to remove the debris as a result of a radiating fuel, such as tin or the like, which forms after EUV radiation without its remaining or adhering within the EUV radiation source device. Furthermore this enables the debris which has deposited in the focusing mirror or the like to be eliminated.

The inventors have found that gaseous tin hydride with a high vapor pressure is most efficiently formed by the two above described measures in the case in which the reacting hydrogen is in the state of hydrogen radicals.

As a result, it was found that the effect of debris as a result of a radiating fuel, such as tin or the like, can be dramatically reduced in the EUV radiation source device. It is further described below that gaseous tin hydride is most efficiently formed by the two above described measures in the case in which the reacting hydrogen is in the state of hydrogen radicals.

On Measure 1

As a process for suppressing debris in the gaseous phase state which is produced in the producing space of the plasma with a high temperature and high density after plasma production, a process was proposed (U.S. Patent Application Publication 2003/0190012 A1) in which an inert gas such as helium (He), krypton (Kr), argon (Ar) or the like is introduced in the direction which is linked to the outlet flow from the producing space for high temperature and high density plasma. The outlet flow contains debris as a result of a radiating fuel, such as tin or the like. In doing so a curtain of inert gas being formed, and thus the debris is prevented from reaching the focusing mirror or the like.

However, even such a gas curtain cannot completely prevent the debris from reaching the focusing mirror or the like. Furthermore, the debris travels to the wall within the EUV device, adheres and deposits as debris even if the direction of continued motion of the debris deviates from the direction of the focusing mirror.

Conversely, in Japanese Patent Application JP 2004-279246 A (U.S. Patent Application Publication 2004/0183038 A1), it is described that hydrogen gas is introduced in the direction which is linked to the outlet flow from the producing space for high temperature and high density plasma. The outlet flow contains debris as a result of a radiating fuel, such as tin or the like.

In this process, Sn, metallic clusters, such as $Sn_x$, $SnH_x$ fragments, which are in the gaseous phase state, and hydrogen gas are chemically reacted with one another, chemically more stable (i.e. less depositing) tin hydride with a high vapor pressure is produced and evacuated without adhering within the device. Tin hydride with a high vapor pressure is produced by this process by a chemical reaction which is formed by the hydrogen gas flow in the direction which is linked to the outlet flow which contains debris. So in the case of the direction of continued motion of the debris changes from the direction to the focusing mirror and the debris continues for example to the wall within the EUV device, the amount which reaches the wall, adheres to it and deposits as debris is reduced to a large extent.

It can be asserted the technique described in Japanese Patent Application JP 2004-279246 A (U.S. Patent Application Publication 2004/0183038 A1), is an effective method. As a result of a test by the inventors, it was found that deposition in the low temperature area within the EUV radiation device cannot be completely eliminated, as was described above.

As a result of vigorous research by the inventors, it was found that, by introducing hydrogen radicals instead of hydrogen gas in the direction which is linked to the outlet flow which contains debris, the amount of debris depositing in the low temperature area within the EUV radiation device is drastically reduced compared to the case of introducing hydrogen gas.

FIG. 1 is a schematic of a test set-up in a study of the amount of tin and/or a tin compound which deposits in the area with the low temperature within the EUV radiation device when hydrogen gas and hydrogen radicals are introduced.

The EUV production method shown in FIG. 1 is a capillary discharge method. As is further described below, a first ring-like main discharge electrode 1a (cathode) and a second ring-like main discharge electrode 1b are arranged such that an insulating material 2 is clamped by them. The inside diameter of the capillary discharge part 3 as the producing part for high density and high temperature plasma which is formed from the insulating material 2 is 3 mm. Raw gas for forming a radiating fuel with high efficiency is supplied to a chamber 10 from a gas supply-evacuation unit 20. In doing so, a gaseous mixture of rare gas and $SnH_4$ was introduced as the raw gas from the gas supply-evacuation unit 20.

Afterwards, a high voltage pulse from a high voltage pulse generating part 50 was applied between the electrodes 1a, 1b, which clamp the insulating material 2, a pulse-like discharge was produced in the capillary discharge part 3, and high density and high temperature plasma was produced. The pulse repetition frequency here was 5 kHz.

The evacuation means of the gas supply-evacuation unit 20 which is connected to the chamber 10 which is provided with the electrode lb evacuates the part which has not contributed to plasma formation, of the gas mixture of rare gas and SnH$_4$ and/or SnH$_4$ which was formed by the recombination of fragments of SnH$_x$ which was formed by the plasma; and fragments of SnH$_x$ with a high vapor pressure.

Within the chamber 10, opposite the capillary discharge part 3, at a position which is around 300 mm away from the middle of the capillary discharge part 3 in the vertical direction, there is a molybdenum (Mo) substrate 100 which is seated on a cooling support 101 and which has a temperature which is regulated by the cooling support 101. The Mo substrate 100 is cooled to the state in which spontaneous vaporization of tin which has deposited on the Mo substrate can be ignored. Cooling proceeds, for example, in such a way that the temperature of the Mo substrate reaches essentially less than or equal to 80° C.

Furthermore, within the chamber there is a hydrogen outlet system 102 arranged such that the capillary discharge part 3 is visible from it. Specifically, this system 102 is arranged such that the hydrogen outlet opening 102f located in it is about 100 mm away from the middle of the capillary discharge part 3 in the vertical direction and that it is about 100 mm away in the direction which orthogonally intersects the middle axis of the capillary discharge part 3.

This system 102 has a valve 102b in which there is a tungsten thermo filament 102a. The valve 102b is made, for example, of silica glass. The thermo filament 102a is connected with an alternating current source 102c by way of a switch 102d. When the switch 102d is moved into the ON state and when the thermo filament 102a is supplied with power from an alternating current source 102c, the thermo filament 102a is heated to roughly 1800° C.

In the vicinity of the two ends of the emission space in which the thermo filament 102a is located, there are a hydrogen feed opening 102e and a hydrogen outlet opening 102f. Hydrogen gas is delivered from the hydrogen (H$_2$) supply unit 103 by way of the hydrogen feed opening 102e into the emission space within the valve 102b in which the thermo filament 102a is located.

In the above described arrangement, the hydrogen gas (H$_2$) was allowed to flow with a flow rate of $1\times10^{-4}$ m$^3$/min from the hydrogen supply unit 103. The amount of tin which deposits on the Mo substrate 100 in the case of the absence of power feeding to the thermo filament is compared to the amount of tin which deposits on the Mo substrate 100 in the case of power feeding the thermo filament 102a. This means that the case of emission of only hydrogen molecules from the opening 102f is compared to the case of the emission of not only of hydrogen molecules, but also a large number of hydrogen radicals which are produced by heating the thermo filament 102a.

As a result of a 1 hour pulse discharge and 1 hour release of hydrogen with a repetition frequency of 5 kHz, the differences described below became apparent. When the switch 102d is in the OFF state, there was no feeding of the thermo filament 102a and when only hydrogen molecules emerged unchanged from the opening 102f, the thickness of the tin film which had deposited on the Mo substrate 100 was roughly 800 nm.

On the other hand, when the switch 102d is moved into the ON state, power is fed to the thermo filament 102 and a large number of hydrogen radicals is produced, the thickness of the tin film which has deposited on the Mo substrate 100 was reduced to roughly 70 nm, i.e., dramatically.

The reason why the amount of deposition in the area with a low temperature within the EUV radiation device is dramatically reduced when hydrogen radicals are introduced compared to the case of introduction of hydrogen gas is not clear. However, the following can be imagined.

In the gas mixture of rare gas and SnH$_4$ which is introduced into the capillary discharge part 3, SnH$_4$ is decomposed by a pulse-like discharge which forms in the capillary discharge part 3, yields fine Sn particles, Sn$_x$ in the metallic cluster state and fragments of SnH$_x$, and they flow in the direction to the Mo substrate 100.

Of the fuels, the SnH$_x$ fragment is evacuated unchanged in the gaseous phase state. Deposition on the Mo substrate 100 hardly takes place. It can be imagined that mainly fine Sn particles and metallic clusters of Sn$_x$ gradually deposit on the Mo substrate 100.

Here, a reaction of fine Sn particles, of Sn$_x$ in the metallic cluster state, and of hydrogen molecules with one another is imagined. When they collide with one another, a bonding reaction occurs comparatively rarely compared to the reaction of fine Sn particles, of Sn$_x$ in the metallic cluster state and of hydrogen molecules with one another, since the two energy states are low. Since furthermore hydrogen molecules are every light, it does not come to the direction of motion of the fine Sn particles and of Sn$_x$ in the metallic cluster state not changing. It can be imagined that a large amount of Sn has deposited on the Mo substrate.

On the other hand, a reaction of the fine Sn particles, of Sn$_x$ in the metallic cluster state and of hydrogen radicals with one another is imagined. Hydrogen radicals are active as compared to hydrogen molecules, i.e., in the high energy state (2H=H$_2$+436 kJ), by which the reaction progresses. Tin yields fragments of SnH$_x$, and furthermore, more stable SnH$_4$. They all have a high vapor pressure, reach a gaseous phase state, and are evacuated by the evacuation means of the gas supply-evacuation unit 20 which is connected to the chamber 10. It can be imagined that, as a result, the amount of Sn deposition on the Mo substrate 100 is dramatically reduced. Specifically, it can be imagined that, in the case in which chemically very active hydrogen radicals have been used compared to use of hydrogen (H$_2$) gas, the gaseous phase reaction with atomic gaseous Sn and Sn$_x$ in the metallic cluster state is accelerated more. In the case of Sn gas in atomic form, the following gas phase equilibrium reactions are assumed.

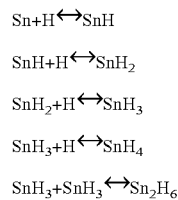

In the presence of hydrogen radicals, such a gaseous phase equilibrium reaction is accelerated, by which fragments, such as SnH$_4$, Sn$_2$H$_6$ or SnH$_x$, are produced. It is assumed that these fragments themselves hardly agglomerate upon contact with the inner surface of the device, as is the case in gaseous atomic Sn, Sn$_x$ in the metallic cluster state or the like. These fragments are evacuated to the outside relatively easily from the vessel (chamber 10) of the EUV radiation source device.

In the case of clusters of metallic atoms, such as tin or the like, the following gaseous phase equilibrium reactions are assumed.

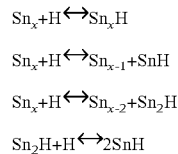

$$Sn_2H+H \longleftrightarrow Sn_2H_2$$

$$Sn_2H_2+H \longleftrightarrow Sn_2H_3$$

$$Sn_2H_3+H \longleftrightarrow Sn_2H_4$$

$$Sn_2H_4+H \longleftrightarrow Sn_2H_5$$

$$Sn_2H_5+H \longleftrightarrow Sn_2H_6$$

When hydrogen radicals proceeding from $Sn_x$ metallic clusters bind with several (number m) metallic atoms, the following gaseous phase equilibrium reactions are assumed.

$$Sn_x+H \longleftrightarrow Sn_{x-m}H+Sn_mH$$

$$Sn_mH \longleftrightarrow SnH+Sn_{m-1}$$

$$Sn_mH+H \longleftrightarrow SnH+Sn_{m-1}H$$

$$Sn_mH+H \longleftrightarrow SnH_2+Sn_{m-1}$$

$$Sn_mH+H \longleftrightarrow 2SnH+Sn_{m-2}$$

$$Sn_mH+H \longleftrightarrow Sn_2H_2+Sn_{m-2}$$

These gaseous phase equilibrium reactions with hydrogen radicals yield clusters of metallic atoms such as Sn gas in atomic form, $Sn_x$ and the like, hydrogen, or they produce fragments by the gaseous phase equilibrium reactions or the like.

Since, on the other hand, the hydrogen gas in itself, in the case of using hydrogen ($H_2$) gas, consists of stable molecules, it can be imagined that the above described different gaseous phase equilibrium reactions are only rarely accelerated. This means that the different gaseous phase equilibrium reactions are accelerated only by using hydrogen radicals. It can be imagined that the amount of deposition of tin and/or tin compounds on the Mo substrate 100 is dramatically reduced.

(2) On Measure 2

The inventors have found that to eliminate the tin and/or tin compounds which have deposited and which are adhering in the area with the low temperature of the above described device, such as in the focusing mirror or the like, as debris, by a reaction of these depositions with hydrogen radicals, gaseous tin hydride is formed with high efficiency and with a high vapor pressure. This process made it possible to evacuate to the outside from the device the substances which had deposited in the area with the low temperature and which lead to reduction of the efficiency of the EUV radiation source device without adhering within the device.

International Patent Application Publication WO 2004/092693 A2 describes that when debris which has been caused by lithium (Li) as the EUV radiating fuel adheres, sputtering takes place on the focusing mirror by helium (He) ion sputtering. Here, the sputtering conditions are a low sputter rate of the molybdenum (Mo) layers comprising a multilayer film of the focusing mirror, and a high sputtering rate of the adhering Li. In WO 2004/092693 A2, it is furthermore indicated as an expansion of the purpose of the above described technique that tin which is present in the focusing mirror is eliminated using hydrogen ion (plasma) sputtering, although the specific arrangement of it is not indicated in the document.

In the elimination of the tin and/or of tin compounds which have deposited in the area with the low temperature of the device, therefore the chemical reaction by hydrogen radicals is compared to hydrogen sputtering.

FIG. 2 shows in a schematic the test set-up in a study of the amount of tin and/or of tin compounds which have deposited in the area with the low temperature within the EUV radiation device when chemical reactions are produced by hydrogen radicals and in hydrogen ion sputtering.

As in the example shown in FIG. 1, the EUV production method is a capillary discharge method. A first ring-like main discharge electrode 1a (cathode) and a second ring-like main discharge electrode 1b are arranged such that an insulating material 2 is clamped by them. The inside diameter of the capillary discharge part 3 as the producing part for high density and high temperature plasma which is formed from the insulating material 2 is 3 mm. As was described above, a gas mixture of rare gas and $SnH_4$ as the raw gas was introduced from a gas supply-evacuation unit 20.

Afterwards a high voltage pulse from a high voltage pulse generating part 50 was applied between the electrodes 1a, 1b, which clamp the insulating material 2, a pulse-like discharge was produced in the capillary discharge part 3 and high density and high temperature plasma was produced. The pulse repetition frequency here was 5 kHz.

The evacuation means of the gas supply-evacuation unit 20 which is connected to the chamber 10 which is provided with the electrode 1b evacuates the part which has not contributed to plasma formation of the gas mixture of rare gas and $SnH_4$ and/or $SnH_4$ which was formed by the recombination of a fragment of $SnH_x$ which was formed by the plasma; and fragments of $SnH_x$ with a high vapor pressure.

Within the chamber 10, at a position from which the capillary discharge part 3 is visible and which is around 300 mm away from the middle of the capillary discharge part 3 in the vertical direction, there is a molybdenum (Mo) substrate 100. If, in this state, in the capillary discharge part 3, a pulse discharge with a repetition frequency of 5 kHz is produced for 15 minutes, a tin film with roughly 200 nm deposited on the Mo substrate.

After completion of the discharge, the change of the tin layer thickness on the Mo substrate 100 in the case of emission of hydrogen ions from a hydrogen ion-radical source 110 in the direction to the Mo substrate 100 was compared to the change of the tin layer thickness on the Mo substrate in the case of emission of hydrogen radicals from a hydrogen ion-radical source 110 in the direction to the Mo substrate 100.

Here, the hydrogen ion-radical source 110 is one of the microwave-plasma type with 200 W. This means that hydrogen gas was supplied to an ion-radical source of the microwave plasma type from a hydrogen ($H_2$) supply unit 103 and hydrogen ions or hydrogen radicals were produced under given operating conditions.

As a result of comparison of the changes of the Sn layer thicknesses on the Mo substrate, the amounts of reduction of the Sn layer thicknesses in the case of emission of hydrogen ions in the direction to the Mo substrate and in the case of emission of hydrogen radicals are essentially identical to one another. In both cases, the tin films on the Mo substrate were completely eliminated after roughly 8 hours of irradiation.

The energy of the hydrogen ions was greater than or equal to 13 eV. It is higher than for hydrogen radicals with roughly 10 eV energy. Furthermore, in Akira Kanabara, *Sputtering Phenomenon*, Tokyo University Press, 1984, page 112-117, it is asserted that in the sputtering of graphite or the like the elimination efficiency by hydrogen ions compared to that by hydrogen radicals is greater than or equal to two places.

Therefore it is assumed that elimination by hydrogen ions is greater than elimination by hydrogen radicals also with respect to the efficiency of tin elimination.

However, as was described above, the tin elimination efficiencies by hydrogen ions and hydrogen radicals were essentially identical by virtue of the test result of the inventors. The reason for this is presumably that the number of hydrogen ions produced in the hydrogen ion-radical source compared to the number of hydrogen radicals is extremely small and that as a result the elimination efficiencies are essentially identical to one another.

This means that it is assumed that to eliminate the tin and/or the tin compounds which have deposited in the area with the low temperature of the device, elimination by hydrogen ions theoretically has a higher efficiency than by hydrogen radicals. However, in practice the efficiency of producing hydrogen ions is less than that of hydrogen radicals, by which only the same elimination efficiencies can be obtained.

Furthermore, in the case of irradiation with hydrogen ions it was found that without precise control of the irradiation ion energy the surface of the Mo substrate 100 is also subjected to ion sputtering and becomes rough. This means that a hydrogen ion source must be used in which precise setting of the irradiation ion energy is possible and in which, moreover, stability of the irradiation ion energy can be accomplished with high precision in order to eliminate tin and/or tin compounds by hydrogen ion irradiation in practice.

In the case, for example, of using hydrogen ion irradiation to eliminate a tin film which has deposited on optical components such as an EUV focusing mirror or the like (a Mo (molybdenum)/Si (silicon) multilayer film and a coating by ruthenium (Ru)), the Sn film can be eliminated. However, it was found that it is very difficult to avoid damage to the Mo/Si multilayer film and the like.

This comparison test was a treatment during an interruption of the discharge for EUV production. If during the discharge operation using hydrogen ions the attempt is made to eliminate the tin film on the Mo substrate, elimination of the tin film, however, becomes difficult for the reason described below.

Within the EUV radiation source device, the gas pressure is at most a few hundred mPa, i.e., is low. Therefore, the Mo substrate 100 cannot be exposed to a large negative bias for ion draw. To prevent generation of an unwanted discharge within the EUV radiation source device, the boundary of the negative bias is roughly −100 V. Therefore, free control of the irradiation ion energy becomes impossible. As a result, it is very difficult to eliminate the tin film without damaging the Mo substrate 100.

On the other hand, in the case of using hydrogen radicals the efficiency of producing hydrogen radicals in the hydrogen ion-radical source is greater than that of hydrogen ions. The surface of the Mo substrate 100 is not damaged, in contrast to the case of hydrogen ions, by which control of the hydrogen radical source with high precision becomes unnecessary and by which inconveniences are avoided.

As was described above, elimination of tin and/or a tin compound by hydrogen ion sputtering is not practical. It was found that tin and/or a tin compound can be effectively eliminated in practice only by a chemical reaction by hydrogen radicals.

The reason why the chemical reaction of tin and/or a tin compound with hydrogen radicals is effective for elimination of the tin and/or tin compound which has deposited in the area with the low pressure of the device is not always clear. However, the following can be postulated.

It can be imagined that the surface of the tin film which has deposited on the Mo substrate has tin and/or compounds of tin with hydrogen, oxygen and the like. When hydrogen molecules and furthermore hydrogen radicals in the high energy state strike it, the tin changes into fragments of $SnH_x$, and particularly, the more stable $SnH_4$.

Here, the surface of the tin film is locally heated by the energy of the hydrogen radicals. It can be imagined that the reaction and vaporization are also accelerated in this way. The $SnH_x$ fragments have a high vapor pressure, reach the gaseous phase state, and are evacuated. It can be imagined that the deposited tin film on the Mo substrate is eliminated as a result of this.

This means that in an EUV radiation source device tin and/or a tin compound agglomerate and adhere to the inner surface of the EUV radiation source device and to the surface of the focusing mirror, and yield a solid. It can be imagined that in the elimination of the above described solid by hydrogen radicals that are formed from a hydrogen radical source, for example, the following reactions occur, although the details of the mechanism are not clear.

In the formula, Sn as a solid is designated Sn (s) (here "s" means solid) and the gaseous fragment is designated SnH (g) ("g" for gaseous). If "$\cdots$" means a chemical bond with a respective Sn atom on the surface of the solid and when $Sn(H_n)$ (s) means that solid Sn contains a number n of H atoms, it can be postulated that the following equilibrium reactions are related:

(a) the equilibrium reaction of desorption of the surface of the solid (shown below using formula (1));

(b) the equilibrium reaction in which hydrogen radicals are contained in the solid Sn or are emitted from it (shown below using formula (2));

(c) the equilibrium reaction in which by the reaction of dissolving out the Sn atoms by hydrogen, fragments, such as SnH, enter the gaseous phase (shown below using formulas (3) and (4)).

  (1)

  (2)

  (3)

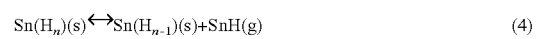  (4)

Furthermore, it can be envisioned that equilibrium reactions are related in which H which is surface-bound to Sn (s) is separated by the following reactions as $SnH_2$ or $Sn_2H_2$.

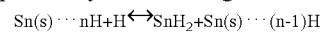

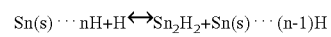

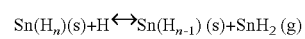

Or it is imagined that the following equilibrium reactions are related in which $SnH_x$ or $Sn_2H_2$ are produced and separated from hydrogen atoms and Sn atoms which adhere to the surface of the solid Sn.

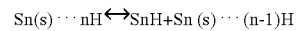

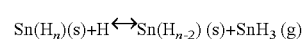

Furthermore it is imagined that moreover a host of complicated equilibrium reactions are related.

The objects are achieved in accordance with the invention as follows by means of the above described findings.

(1) In an extreme UV radiation source device which comprises the following:

a vessel in which high density and high temperature plasma is formed;

a raw material supply means which supplies to this vessel a raw material which contains tin and/or a tin compound as the EUV radiating fuel;

a heating/excitation means which heats/excites the raw material supplied to the above described vessel and thus produces high density and high temperature plasma;

an evacuation means which is connected to the vessel; and an exit part for EUV radiation from which the EUV radiation emitted by the high density and high temperature plasma emerges, in that there is a means for feeding hydrogen radicals in the above described vessel.

In maintenance or the like of the device, the above described debris which has deposited in the area with the low temperature of the above described device can be eliminated by removing the area with a low temperature of the device from the above described vessel and supplying the above described hydrogen radicals to the contaminated area which contains Sn and/or Sn compounds which have collected in the area with the low temperature of the device.

The above described EUV radiation source device can also be arranged as follows:

(2) In the EUV radiation source device described above in (1), there are a raw material supply means, a heating or excitation means, an evacuation means and a control element which controls operation of the raw material supply means, the heating or excitation means and the means for feeding hydrogen radicals.

(3) In the EUV radiation source device described above in (1) and (2), a means for feeding hydrogen radicals supplies hydrogen radicals to debris formed from the raw material after heating or excitation in an area of the optical path defined between a part where high density and high temperature plasma is formed and an exit part for EUV radiation.

(4) In the EUV radiation source device described above in (1), (2) and (3), hydrogen radicals are routed onto the produced substance which is present on the reflection surface of the focusing mirror which is located in the above described area of the optical path.

(5) In the EUV radiation source device described above in (1), (2) and (3), hydrogen radicals are routed onto the produced substance which is present in the space within the area of the optical path between the focusing mirror which is located in the above described area of the optical path and the area in which the high density and high temperature plasma is formed.

(6) In the EUV radiation source device described above in (2), (3) and (4), the above described control element operates the above described means for feeding hydrogen radicals during an interruption of the operation of producing high density and high temperature plasma by the above described heating/excitation means.

(7) In the EUV radiation source device described above in (2), (3) (4) and (5), the above described control element operates the above described means for feeding hydrogen radicals during the operation of producing high density and high temperature plasma by the above described heating/excitation means.

(8) In the EUV radiation source device described above in (4) to (7), there is a protective hydrogen radical diffusion wall in the outer periphery of the above described focusing mirror.

(9) In the EUV radiation source device described above in (4) to (8), the above described focusing mirror has a multiple arrangement of several mirrors with center axes of rotation which come to rest on one another such that the focal positions essentially coaxially agree with one another. This multiple arrangement is supported by a column in order to be kept upright, in which there is a continuous cavity. The surface of this column is provided with several openings. Hydrogen radicals are routed into this cavity by the above described means for feeding hydrogen radicals. Hydrogen radicals are delivered from these openings.

(10) In the EUV radiation source device described above in (4) to (9), there is a means which moves such that the focusing mirror and the means for feeding hydrogen radicals approach one another during an interruption of the operation of producing a high density and high temperature plasma by the above described heating/excitation means of at least one of the above described focusing mirrors and the above described means for feeding hydrogen radicals.

(11) In the EUV radiation source device described above in (4) to (9), the focusing mirror is located repeatedly and interchangeably in the vessel in which the high density and high temperature plasma is formed and hydrogen radicals are routed onto at least one of the other focusing mirrors, while one focusing mirror focuses the EUV radiation.

(12) In the EUV radiation source device described above in (1) to (11), the above described heating/excitation means has a pair of discharge electrodes and produces through discharge high density and high temperature plasma by heating/excitation of the supplied raw material.

(13) In the EUV radiation source device described above in (1) to (11), the above described heating or excitation means has a laser beam irradiation means, heats/excites the above described supplied raw material by irradiation with laser beams, and produces high density and high temperature plasma.

(14) In the EUV radiation source device described above in (1) to (13), the above described raw material is a gas which contains at least tin hydride with a high vapor pressure.

(15) In the EUV radiation source device described above in (14), the above described tin hydride is $SnH_4$.

The following effects can be obtained as in accordance with the invention.

(1) As the applicant proposed in Japanese Patent Application JP 2004-279246 A (US Patent Publication US 2004/0183038 A1), by using $SnH_4$ which is a radiating fuel as the raw material, the above described advantages can be obtained that after plasma formation, evacuation in the atomic gaseous state is easy and there is hardly any deposition in the low temperature area of the device. However, there is still the disadvantage that in the low temperature area of the device tin and/or a tin compound deposits.

In accordance with the invention, by introducing hydrogen radicals, the deposition of tin and/or a tin compound in the area with the low temperature can be suppressed even if a raw material which contains tin and/or a tin compound as an EUV radiating fuel is supplied. Furthermore, it becomes possible to eliminate the deposited tin and/or tin compounds. Therefore, it became possible to suppress degradation of the device as a result of the tin and/or tin compounds which have deposited in the low temperature area of the device.

(2) By supplying hydrogen radicals to the tin and/or tin compound which has deposited on the reflection surface of the above described focusing mirror, during operation of the device or during an interruption of it, it becomes possible to form gaseous tin hydride (for example $SnH_4$) with a high vapor pressure and to evacuate it by an evacuation means. Therefore, it became possible to clean the focusing mirror.

(3) By supplying hydrogen radicals to the above described formed substance in the space within the area of the optical path between the focusing mirror and the area in which high density and high temperature plasma forms, it becomes possible to react tin in the gaseous phase state, $Sn_x$ as metallic clusters, fragments of $SnH_x$ and the like with hydrogen radicals to form gaseous tin hydride (for example, $SnH_4$) with a high vapor pressure and to evacuate it by an evacuation means. Therefore it becomes possible to reduce fine tin particles and metallic clusters of tin which travel to the focusing mirror or the like.

(4) The density of the hydrogen radicals in the vicinity of the focusing mirror can be increased by the arrangement of a protective hydrogen radical diffusion wall in the outer periphery of the focusing mirror. Thus, tin and/or a tin compound which has deposited on the focusing mirror can be quickly eliminated.

(5) By delivering hydrogen radicals from an opening which is located on the surface of the column to maintain the multiple arrangement of the above described focusing mirror, the hydrogen radicals can be released in a position in the vicinity of the reflection surface of the focusing mirror. Thus it becomes possible to eliminate tin and/or tin compounds which have deposited on the focusing mirror even during operation of the device in a short time.

(6) By an arrangement of the means which moves at least one of the above described focusing mirrors and the above described means for feeding hydrogen radicals such that the two approach one another, during an interruption in the operation of producing high density and high temperature plasma the means for feeding hydrogen radicals can be pushed into the above described area of the optical path and the hydrogen radicals can be effectively delivered onto the surface of the focusing mirror. Therefore, the tin and/or tin compounds which have deposited on the focusing mirror can be effectively eliminated in a short time.

(7) By the measure that, in the vessel in which the high density and high temperature plasma is formed, the above described focusing mirror which comprises a multiple mirror arrangement is arranged repeatedly and interchangeably and that during the action of one of the focusing mirrors for focusing the EUV radiation, hydrogen radicals are delivered at least onto one of the other focusing mirrors, it is possible to focus by means of one focusing mirror, and moreover, to eliminate the tin and/or tin compounds which have deposited on the other focusing mirror. Thus, the duration of stoppage of the device for eliminating the tin and/or tin compound can be shortened or eliminated and the operating capacity of the system can be increased.

(8) By the measure that the raw material as the radiating fuel comprises gas with a high vapor pressure which contains tin hydride, especially $SnH_4$, effects can be obtained that it is not necessary to heat to a high temperature, that transport takes place easily, that control of the tin concentration takes place easily and that agglomeration and deposition hardly take place in the low temperature area within the device after plasma formation.

The invention is further described below with reference to the accompanying drawings.

BRIEF DESCRIPTION OF THE DRAWINGS

FIGS. 12(a) & 12(b) each show a schematic of the arrangement of one example of the EUV focusing mirror according to the embodiment shown in FIG. 11.

DESCRIPTION OF THE PREFERRED EMBODIMENTS

Figure 1:
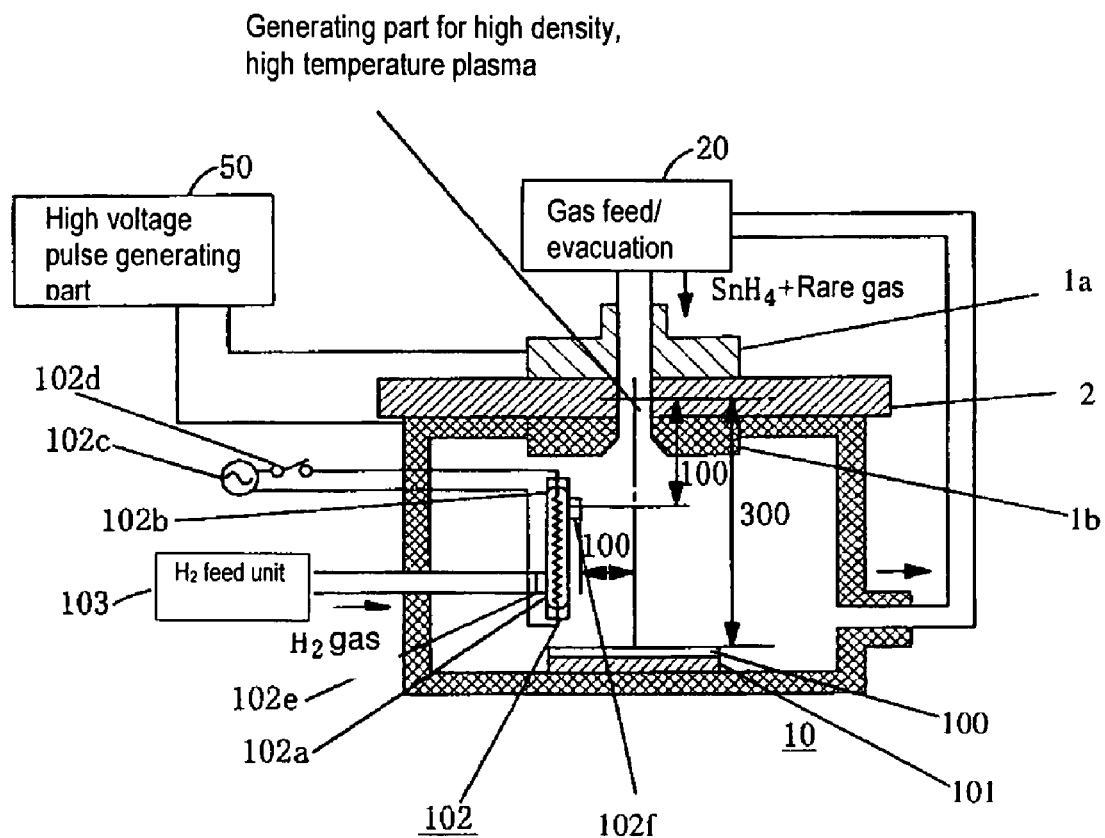
FIG. 1 is a schematic depiction of the arrangement of a test in which hydrogen gas and hydrogen radicals were introduced and the amount of tin and/or tin compound was studied.
Figure 2:
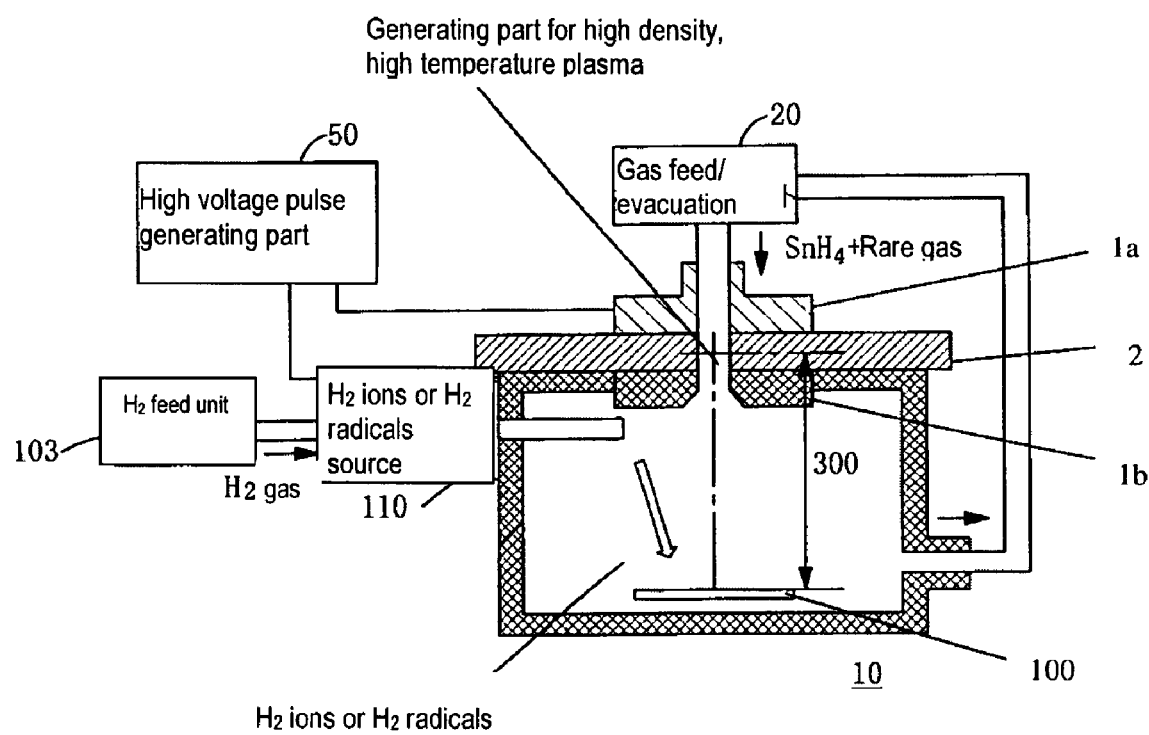
FIG. 2 is a schematic depiction of the arrangement of a test in which the amount of tin and/or tin compound was studied when a chemical reaction of hydrogen radicals was carried out and when hydrogen ion sputtering was carried out.
Figure 3:
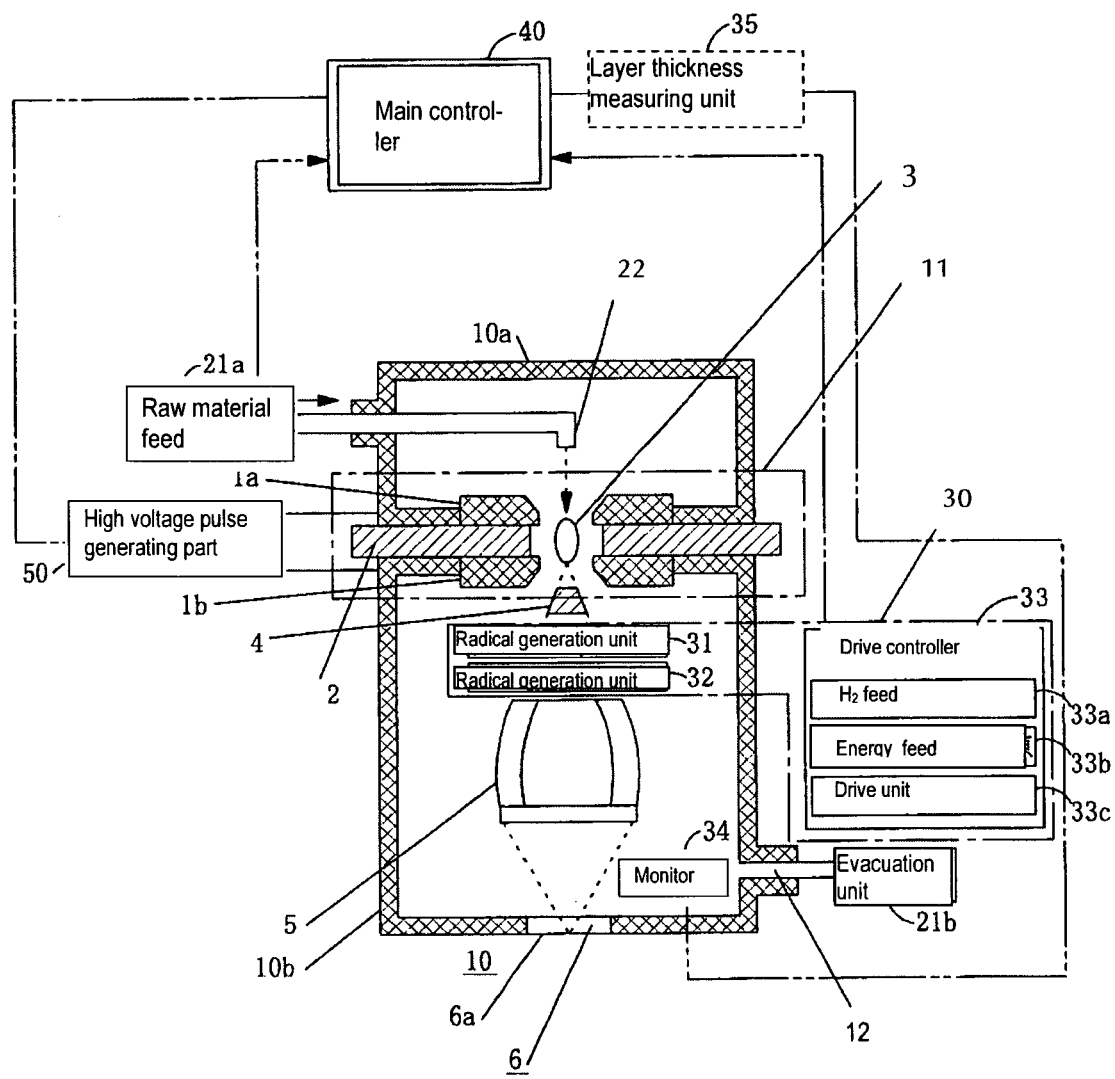
FIG. 3 is a schematic representation of an arrangement in which the invention is applied to an EUV radiation source device of the DPP type.

FIG. 3 schematically shows an arrangement of an EUV radiation source device for use in accordance with the invention. Here, an EUV radiation source device of the DPP type is shown.

As FIG. 3 shows, the EUV radiation source device of the DPP type has a chamber 10 as the discharge vessel in which, for example, a first ring-like main discharge electrode 1(a) (cathode) and a second ring-like main discharge electrode 1(b) (anode) are arranged such that a ring-like insulating material 2 is clamped by them. The first main discharge electrode 1a and the second main discharge electrode 1b are made, for example, of a metal with a high melting point, such as tungsten, molybdenum, tantalum or the like. The insulating material 2 is, for example, made of silicon nitride, aluminum nitride, diamond or the like.

The ring-like first main discharge electrode 1a, the ring-like second main discharge electrode 1b and the insulating material 2 are arranged such that their respective through openings are essentially coaxial, and thus, form a continuous opening. If a discharge forms between the electrodes 1a, 1b, high density and high temperature plasma is produced in this through opening or in its vicinity.

The electrodes 1a, 1b and the insulating material 2 form an EUV radiation generating part 11 of the DPP type. As was described above, there are examples of different arrangements in the DPP type for which, however, reference is made to the aforementioned publication J. Plasma Fusion Res., March 2003, Vol. 79, No. 3, pp. 219-260.

The chamber 10 comprises a first vessel 10a on the side of the electrode 1a and of a second vessel 10b on the side of the electrode 1b. The two vessels 10a, 10b form an electrically conductive component and are separated and insulated from one another by the insulating material 2. Here, the second vessel 10b of the chamber 10 and the electrode 1b are grounded.

Raw material which is used to form a high efficiency radiating fuel which emits radiation with a wavelength of 13.5 nm in the generating part 3 for high density and high temperature plasma of the EUV radiation generation part 11 is introduced into the chamber 10 from the raw material supply unit 21 a by way of a nozzle-like raw material feed part 22 on the side of the first vessel 10a. The added raw material is supplied to the EUV radiation generation part 11 and used for plasma formation. That part of the raw material which has not contributed to plasma formation, and/or fragments and the like which are formed from the plasma, flow in the chamber 10 and are released into an outlet unit 21b by an outlet opening 12 which is located on the side of the second vessel 10b.

The raw material for supplying the radiating fuel need not always be a discharge gas which contains tin hydride, such as, for example, $SnH_4$ or the like, but can be, for example, liquid or a solid. When tin is supplied as the EUV radiating fuel to the generating part for high density and high temperature plasma, tin vapor can also be supplied without being limited to $SnH_4$, by vaporization by laser irradiation of tin, by self-heating of a tin supply source by a discharge. Furthermore the above described discharge gas can be diluted with rare gas and supplied in this way.

The pressure of the generating part 3 for high density and high temperature plasma is regulated by a main controller 40 to 1 Pa to 20 Pa. Roughly −5 to −20 kV voltage is applied to the vessel 10b and the electrode 1b as well as the vessel 10a and the electrode 1a from a high voltage pulse generation part 50. As a result, a plasma discharge with a high density and high temperature forms in the generating part 3 for high density and high temperature plasma between the electrodes 1a, 1b. EUV radiation with a wavelength of 13.5 nm is emitted from this plasma.

The emitted EUV radiation is focused by an EUV focusing mirror 5 which is located in the vessel 10b on the side of electrode 1b, and emerges from an EUV radiation exit part 6 which has a wavelength selection means 6a to the irradiation part which constitutes an optical system (not shown) on the side of the exposure machine. The wavelength selection means 6a selects, for example, EUV radiation with a wavelength of 13.5 nm. This means that EUV radiation which has been selected by the means 6a, for example, with a wavelength of 13.5 nm, emerges in the direction to the optical system on the side of the exposure device.

The EUV focusing mirror 5 has several mirrors which, for example, have the shape of an ellipsoid of rotation with different diameters or the shape of a paraboloid of rotation with different diameters. These mirrors are arranged coaxially such that the center axes of rotation come to rest on one another so that the focal positions essentially agree with one another. This mirror can advantageously reflect EUV radiation with an oblique incidence angle from 0° to 25° by, for example, the reflection surface of the substrate material with a smooth surface of nickel (Ni) or the like being precisely coated with a metal such as ruthenium (Ru), molybdenum (Mo), rhodium (Rh) or the like.

Between the high density and high temperature plasma and the EUV focusing mirror 5, there is a debris trap 4 which captures debris such a metal powder and the like, debris resulting from a radiating fuel, such as tin or the like, and similar debris, and passes only EUV radiation. The above described debris such as metal powder and the like is produced by sputtering of a metal which is in contact with the high density and high temperature plasma (for example, in the case of an EUV radiation source device of the LPP type a nozzle for supply of the EUV radiating fuel to the plasma producing area, in the case of an EUV radiation source device of the DPP type, a discharge electrode) by the plasma. The debris trap 4, as described, for example, in JP 2002-504746 A (U.S. Pat. No. 6,359,969 B1), is formed of several plates which are arranged in the radial direction of the area in which high density and high temperature plasma is produced.

For tin which has a low vapor pressure and which is solid at normal temperature, when a high density and high temperature plasma is produced by heating/excitation, debris such as metal powder and the like and a large amount of debris resulting from the radiating fuel (Sn or the like) are formed, debris such as metal powder and the like being produced by the metal which is in contact with a high density and high temperature plasma being subjected to sputtering by the plasma. This debris is captured by the debris trap. Most of the debris as a result of the radiating fuel, such as Sn or the like, however, often passes through the debris trap 4 as a result of its weight which is lighter than that of the debris, such as metal powder and the like, and as a result of its weakly pronounced property of propagating in a straight line.

The debris as a result of the radiating fuel, such as tin or the like, which has passed through the debris trap 4 reaches the vessel 10b, adheres and deposits, for example, on the EUV focusing mirror 5, by which a reduction of the EUV radiation reflection factor of the EUV focusing mirror 5 is caused. To maintain the efficiency of the device, such as, for example, of the EUV radiation intensity, and to prevent degradation, the following is therefore necessary:

a reduction of the degradation of the efficiency of the device by adherence of debris as a result of the radiating fuel such as tin or the like, within the device of the EUV radiation source; and at the same time the elimination of the deposited tin and/or of the tin compound with high efficiency, even if the debris collects as tin and/or a tin compound within the EUV radiation source device.

In accordance with the invention, the following measure suppresses the degradation of the efficiency of the device by adhesion of debris as a result of the radiating fuel, such as tin or the like, within the device of the EUV source:

Sn (tin), $Sn_x$ metallic clusters, and fragments of $SnH_x$ which are in the gaseous phase state and which are formed after producing the high density and high temperature plasma, are reacted with hydrogen radicals in the gaseous phase state; thus gaseous tin hydride with a high vapor pres sure, especially more stable $SnH_4$ which poorly deposits, is thus formed; and the gaseous tin hydride is evacuated by an evacuation means.

Furthermore, according to the invention deposited tin and/or tin compound is eliminated with high efficiency by the following measure:

tin and/or a tin compound which adheres as debris in the low temperature area of the device, such as on the EUV focusing mirror 5 or the like, and which have deposited in the low temperature area are reacted with hydrogen radicals;

gaseous tin hydride with a high vapor pressure, especially more stable $SnH_4$ which poorly deposits, is thus formed; and the gaseous tin hydride is evacuated by an outlet unit 21b.

This means that gaseous tin hydride with a high vapor pressure is formed by the debris as a result of the radiating fuel, such as tin or the like, being reacted with hydrogen while present in the space in the gaseous phase state, or by the above described deposition being reacted with hydrogen even in the case in which the debris comes into contact with the low temperature area of the device and collects as tin and/or a tin compound. Afterwards, it is evacuated by the outlet unit 21b which is located in the EUV radiation source device.

This measure makes it possible to effectively draw off the debris as a result of the radiating fuel, such as tin or the like which forms after EUV radiation, without its remaining within the EUV radiation source device or adhering to it.

In the EUV radiation source device which is shown in FIG. 3 and in which the invention is used, therefore, there are means for producing hydrogen radicals 30, a monitor unit 34 and a layer thickness measurement means 35.

The means for producing hydrogen radicals 30 comprises radical producing parts 31, 32 and a drive control element 33 for producing hydrogen radicals in the radical producing parts 31, 32. The radical producing parts 31, 32 are placed on a movement device (not shown) and are kept movable up/down and right/left within the chamber, as shown in FIG. 3.

The drive control element 33 comprises the following:

a hydrogen supply source 33a for supplying hydrogen gas as the raw material of the hydrogen radicals to the radical producing parts 31, 32;

an energy supply source 33b for supply of energy for producing radicals in the radical producing parts 31, 32 to which hydrogen gas has been supplied; and a drive unit 33c for executing position control of the radical producing parts 31, 32.

The operation of the means 30 is controlled by the main controller 40.

As was described above, Sn (tin), $Sn_x$ metallic clusters, and fragments of $SnH_x$ which are in the gaseous phase state and which are produced after producing the high density and high temperature plasma, are evacuated from the outlet unit 21b which is located in the vessel 10b. This means that within the vessel 10b an outlet flow which contains debris is formed.

The radical producing part 31 is arranged such that the emission direction of the hydrogen radicals which are released from it orthogonally intersects the outlet flow which contains the debris.

On the other hand, the radical producing part 32 is arranged such that the emission direction of the hydrogen radicals which are released from it is opposite the area with the low temperature within the chamber 10 in which the tin and/or tin compound has deposited, for example, on the surface of the EUV focusing mirror 5.

The monitoring unit 34 is used to determine the amount of tin and/or tin compound which deposits on the EUV focusing mirror 5. It is used as a monitor for confirming the presence or absence of an deposition which adheres to the EUV focusing mirror 5, and for computing the treatment rate of the deposition and the like. The monitor unit 34 is, for example, a layer thickness monitor of the crystal oscillator type. It is located in the vicinity of the EUV focusing mirror 5, specifically at the position which deviates from the optical path of the EUV radiation.

This means that by determining the substance which has deposited on the layer thickness monitor and which is located in the vicinity of the EUV focusing 5 mirror, the deposition state of the substance which has deposited on the EUV focusing mirror 5 is determined.

The determination signal from the monitor unit 34 is sent to the layer thickness measurement means 35 which, based on the received determination signal, computes the amount, the treatment rate and the like of the tin and/or tin compounds which have deposited on the EUV focusing mirror 5, and assesses the presence or absence of the deposited substance. The result of this computation and result of the assessment are sent from the layer thickness measurement means 35 to the main controller 40.

The EUV radiation source device with the means for producing hydrogen radicals 30 shown in FIG. 3 is operated as follows.

The means for producing hydrogen radicals 30 is operated during EUV radiation emission operation of the EUV radiation source device. Hydrogen radicals are produced in the chamber 10.

In the radical producing part 31 which is arranged such that the outlet flow which contains debris crosses the debris emission direction, hydrogen radicals are produced and released. The hydrogen radicals which have been released from the radical producing part 31 react with Sn in the gaseous phase state, $Sn_x$ metallic clusters, fragments of $SnH_x$ and the like, form gaseous tin hydride with a high vapor pressure (for example $SnH_4$) and the product is evacuated with the outlet unit 21b as the evacuation means. This means that fine tin particles and tin clusters which travel to the EUV focusing mirror 5 or the like are reduced.

Likewise, in the radical producing part 32 which is arranged such that the emission direction of the hydrogen radicals is opposite the area with the low temperature within the chamber 10 in which the tin and/or tin compound has deposited, for example, on the surface of the EUV focusing mirror 5, hydrogen radicals are produced and emitted. The hydrogen radicals which have been released from the radical producing part 32 react with tin and/or a tin compound which has deposited in the low temperature area of the device, such as on the EUV focusing mirror 5, form gaseous tin hydride with a high vapor pressure (for example, $SnH_4$) and the product is evacuated with the outlet unit 21b. This means that the EUV focusing mirror 5 or the like is cleaned.

The main controller 40 receives the result of computing the amount of tin and/or tin compounds which have deposited on the EUV focusing mirror 5, the treatment rate of the deposited substance and the result of assessing the presence or absence of deposition which are sent based on the determination signal of the layer thickness measurement means 35 which has been sent by the monitor unit 34. The main controller 40 now assesses the optimum hydrogen radical treatment conditions. The main controller 40 controls the means for producing hydrogen radicals 30 such that these optimum hydrogen radical treatment conditions are implemented. Furthermore, it operates the hydrogen radical producing parts 31, 32 such that tin and/or a tin compound does not deposit in the area with a low temperature within the chamber 10 which influences the device efficiency of the EUV focusing mirror 5.

The treatment of the above described debris as a result of the radiating fuel, such as tin or the like, by the hydrogen radicals can be carried out during stoppage or interruption of EUV radiation emission operation. Furthermore, there can be only one of the radical producing parts 31, 32.

The amount of tin and/or tin compounds which have deposited on the EUV focusing mirror or the like can also be computed as follows.

It can be envisioned that the amount of Sn and/or Sn compounds which have deposited on the EUV focusing mirror 5 depends on several parameters, for example, the frequency of EUV emission, the amount of energy supplied to the generating part 3 for high density and high temperature plasma (i.e., the voltage supplied and applied between the electrodes 1a, 1b and the like), and the amount of raw material of the radiating fuel delivered to the generating part 3 for high density and high temperature plasma per unit of time. The main controller 40 stores a table of the relation between the amounts of these several parameters and the amount of tin and/or tin compound which has deposited on the EUV focusing mirror 5 beforehand, and acquires and stores the data on these parameters each time.

The amount of tin and/or tin compounds which have deposited on the EUV focusing mirror 5 or the like can be computed by this comparison of the acquired parameter data and the above described table which has been stored beforehand. In this case the monitor unit 34 and the layer thickness measurement means 35 are no longer needed.

Instead of the monitor unit 34 and the layer thickness measurement means 35, there can be a light monitor which samples part of the EUV radiation emitted from the EUV radiation source device and measures the EUV radiation intensity, and an arithmetic means. The arithmetic means compares the light intensity which has been determined by the light monitor to the initial EUV radiation intensity (for example, light intensity for nondeposition of tin and/or a tin compound on the EUV focusing mirror 5) and based on the degree of attenuation of the EUV radiation intensity, computes the amount of tin and/or tin compound which has deposited on the EUV focusing mirror 5 or the like.

Figure 4:
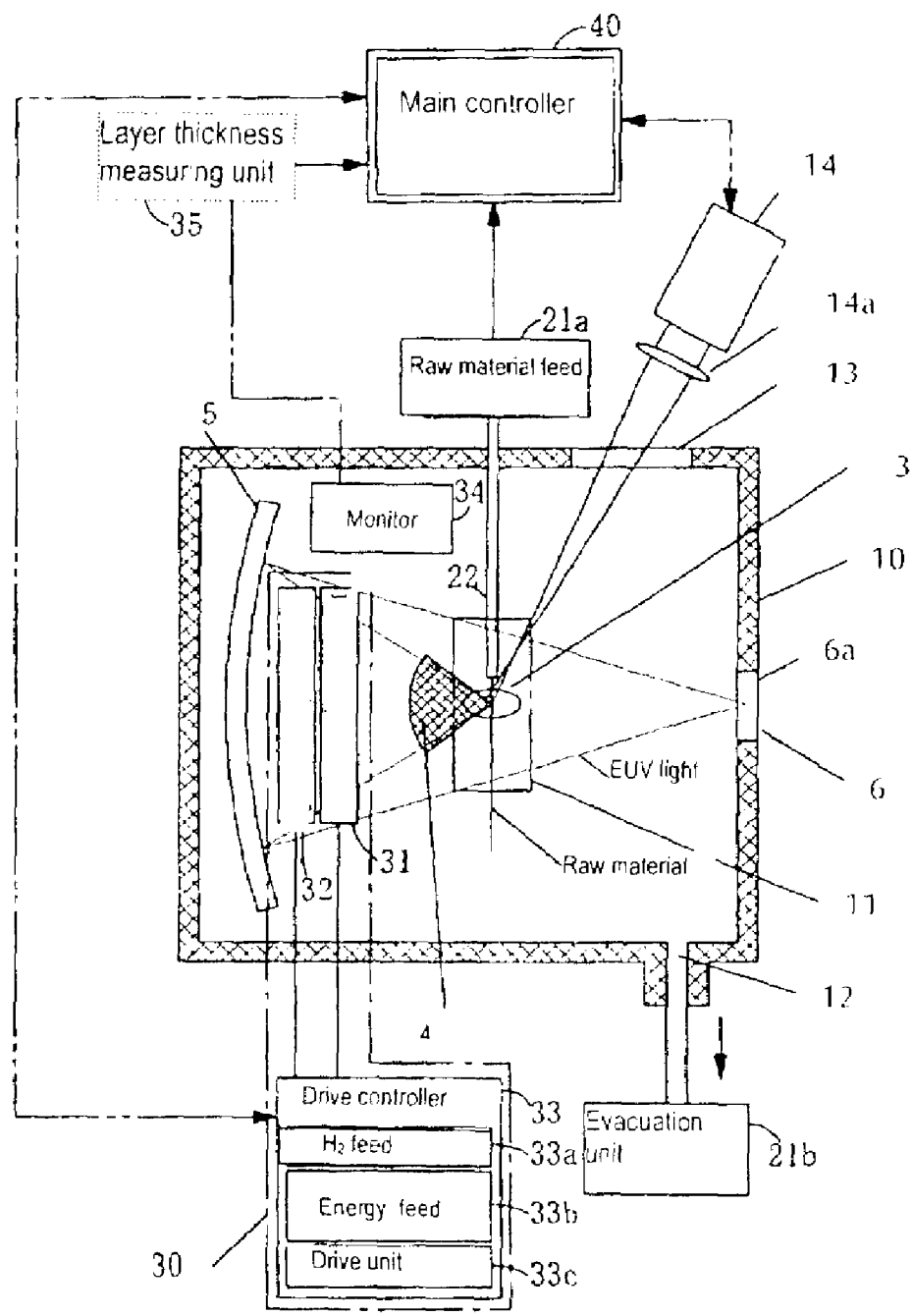
FIG. 4 is a schematic representation of an arrangement in which the invention is applied to an EUV radiation source device of the LPP type.

FIG. 4 schematically shows the arrangement in the case of using the invention for an EUV radiation source device of the LPP type. Here, the same parts as in FIG. 3 are provided with the same reference numbers as in FIG. 3 and are no longer further described.

As FIG. 4 shows, the EUV radiation source device of the LPP type has a chamber 10 as the discharge vessel. In the chamber 10, there are a nozzle-like raw material feed part 22 for supply of the raw material as the radiating fuel to the chamber 10, a laser beam entry window 13 to which laser beam is routed, an outlet opening 12 to which the outlet unit 21b is connected, and an EUV radiation exit part 6 with a wavelength selection means 6a.

The raw material is fed into the chamber 10 from the raw material feed part 22 which is connected to the raw material supply unit 21a and which penetrates the chamber 10. The raw material is used to form a radiating fuel with high efficiency which in the generating part 3 for high density and high temperature plasma of the EUV radiation generation part 11 emits EUV radiation with a wavelength of 13.5 nm, and is, for example, $SnH_4$, as was described above. The supplied raw material flows within the chamber 10 and travels to the gas outlet opening 12 which is located in the chamber 10.

The outlet unit 21b comprises a gas evacuation means, such as a vacuum pump or the like, and is connected to the above described gas outlet opening 12. As was described above, the raw material is supplied to the EUV radiation generation part 11 and is used to form plasma. That part of the raw material which has not contributed to plasma formation, and/or fragments and the like which are formed from the plasma, flow into the chamber 10 and are released into an outlet unit 21b from an outlet opening 12 which is located on the side of the second vessel 10b.

The raw material for supplying the radiating fuel can be, for example, liquid, solid or gaseous, such as for example $SnH_4$ or the like, as was described above. When tin is supplied as the EUV radiating fuel to the generating part for high density and high temperature plasma, tin can also be heated, vaporized by laser radiation or the like, and supplied as tin vapor.

A laser device 14 generates laser beam which is emitted via the laser beam entry window 13 onto the EUV radiation generating part 11. Thus, it is, for example, a pulsed laser device with a repetition frequency of a few kHz. A YAG laser device, a carbon dioxide gas laser device, an excimer laser device, or the like is used for this purpose. The laser beam which has been emitted from the laser device is fed from the laser beam entry window 13 into the chamber 10, having been focused by a laser beam focusing means 14a, such as a convex lens or the like. The raw material supplied by the raw material feed part 22 is irradiated with the laser beam which has been fed from the laser beam entry window 13. The raw material is fed in the direction toward the focusing point of the laser beam which is focused by the means 14a. The raw material which is irradiated with the laser beam is heated/excited, by which plasma with a high density and a high temperature is formed from which EUV radiation with a wavelength of 13.5 nm is emitted.

The emitted EUV radiation is incident on the EUV focusing mirror 5 which is located in the chamber 10, is reflected by the EUV focusing mirror 5, and from the EUV radiation exit part 6 with a wavelength selection means 6a enters the irradiation part as the optical system on the side of the exposure device which is not shown in the drawings.

The wavelength selection means 6a, as described above, selects EUV radiation with a wavelength of 13.5 mm. This means that EUV radiation, for example, with a wavelength of 13.5 nm, which has been selected by the wavelength selection means emerges in the direction to the optical system on the side of the exposure device.

The EUV focusing mirror 5 is, for example, a spherical mirror. Because, for this purpose, a reflector is used in which, for example, a multilayer arrangement of molybdenum (Mo) and silicon (Si) is formed, the EUV radiation can be advantageously reflected. In the case of such a reflector, the latter in and of itself has a wavelength selection property. Therefore, there are also cases in which the wavelength selection means 6a is not needed.

Between the generating part 3 for the high density and high temperature plasma and the EUV focusing mirror 5, there is a debris trap 4 which captures debris, such as metal powder and the like, debris resulting from a radiating fuel such as tin or the like, and similar debris, and passes only EUV radiation. The above described debris, such as metal powder and the like, is produced by sputtering of a metal which is in contact with the high density and high temperature plasma (for example, raw material feed part 22) by the plasma. The debris trap 4, as described, for example, in JP 2002-504746 A (U.S. Pat. No. 6,359,969 B1), comprises several plates which are arranged in the radial direction of the area in which high density and high temperature plasma is produced, as was described above.

As in the EUV radiation source device shown in FIG. 3 and also in the EUV radiation source device of the LPP type shown in FIG. 4, there are a means for producing hydrogen radicals 30, a monitor unit 34 and a layer thickness measurement means 35 in order to draw off debris as a result of the radiating fuel, such as tin or the like which forms after EUV radiation, without its remaining within the EUV radiation source device or adhering to it.

The means for producing hydrogen radicals 30, as was described above, is comprised of a radical producing part 31, a radical producing part 32, and a drive control element 33 for producing hydrogen radicals in the radical producing parts 31 and 32. The radical producing parts 31, 32 are placed on a movement device (not shown) and are kept within the chamber to be able to move up/down and right/left, as shown in FIG. 4.

The drive control element 33 comprises:

a hydrogen supply source 33a for supply of hydrogen gas as the raw material of the hydrogen radicals to the radical producing parts 31, 32;

an energy supply source 33b for supply of energy for producing radicals in the radical producing parts 31, 32 to which the hydrogen gas has been supplied; and a drive unit 33c for executing position control of the radical producing parts 31, 32.

The radical producing part 31 is arranged such that the emission direction of the hydrogen radicals which have been emitted by the radical producing part 31 crosses the outlet flow which contains debris. On the other hand, the radical producing part 32 is arranged such that the emission direction of the hydrogen radicals which are emitted by it is opposite the area with the low temperature within the chamber 10 in which the tin and/or tin compound has deposited, for example, on the surface of the EUV focusing mirror 5.

The monitoring unit 34 determines, as was described above, the amount of tin and/or tin in compound which has deposited on the EUV focusing mirror 5. This determination signal is sent to the layer thickness measurement means 35 which, based on the received determination signal, computes the treatment rate of the amount of the tin and/or tin compound which has deposited on the EUV focusing mirror 5 and the deposition and the like, and assesses the presence or absence of deposition. The result of this computation and the result of the assessment are sent from the layer thickness measurement means to the main controller 40.

The EUV radiation source device with the means for producing hydrogen radicals shown in FIG. 4 is operated as follows.

The means for producing hydrogen radicals 30 is operated during EUV radiation emission operation of the EUV radiation source device. Hydrogen radicals are produced in the chamber 10.

In the radical producing part 31 which is arranged such that the outlet flow which contains debris crosses the debris emission direction, hydrogen radicals are produced and released. The hydrogen radicals which have been released from the radical producing part 31 react with Sn (tin) $Sn_x$ metallic clusters, fragments of $SnH_x$ and the like, which are in the gaseous phase state, form gaseous tin hydride with a high vapor pressure (for example, $SnH_4$) and the product is evacuated by means of the outlet unit 21b.

Likewise, hydrogen radicals are produced and emitted in the radical producing part 32 which is arranged such that the emission direction of the hydrogen radicals is opposite the area with the low temperature within the chamber 10 in which the tin and/or tin compound has deposited, such as on the surface of the EUV focusing mirror 5 or the like. The hydrogen radicals which have been emitted from the radical producing part 32 react with tin and/or a tin compound which have deposited in the low temperature area of the device, such as on the EUV focusing mirror 5, form gaseous tin hydride with a high vapor pressure (for example, $SnH_4$) and the product is evacuated by means of the outlet unit 21b. This means that the EUV focusing mirror 5 or the like is cleaned.

The main controller 40 receives the results of computing the amount of tin and/or tin compound which has deposited on the EUV focusing mirror 5, as well as the treatment rate of the deposited substance and the result of assessing the presence or absence of deposition which are sent based on the determination signal of the layer thickness measurement means 35 which has been sent by the monitor unit 34. The main controller 40 now assesses the optimum hydrogen radical treatment conditions. The main controller 40 controls the means for producing hydrogen radicals 30 such that these optimum hydrogen radical treatment conditions are implemented. Furthermore, the controller operates the hydrogen radical producing parts 31, 32 such that tin and/or a tin compound does not deposit in the area with a low temperature, which is a EUV focusing mirror 5 or the like, within the chamber, which influences the device efficiency.

The specific arrangement of one example of the EUV radiation source device in accordance with the invention is described below. An EUV radiation source device of the DPP type is described below. However, an application can also be found for the above described EUV radiation source device of the LPP type. A case of using $SnH_4$ gas as the raw material is described below. But, as was described above, raw material in the form of a solid which contains tin, liquid raw material, gas which contains tin hydride, gas which has been formed by dilution of a gas which contains tin hydride with a rare gas, or the like, can be used.

First Embodiment

Figure 5:
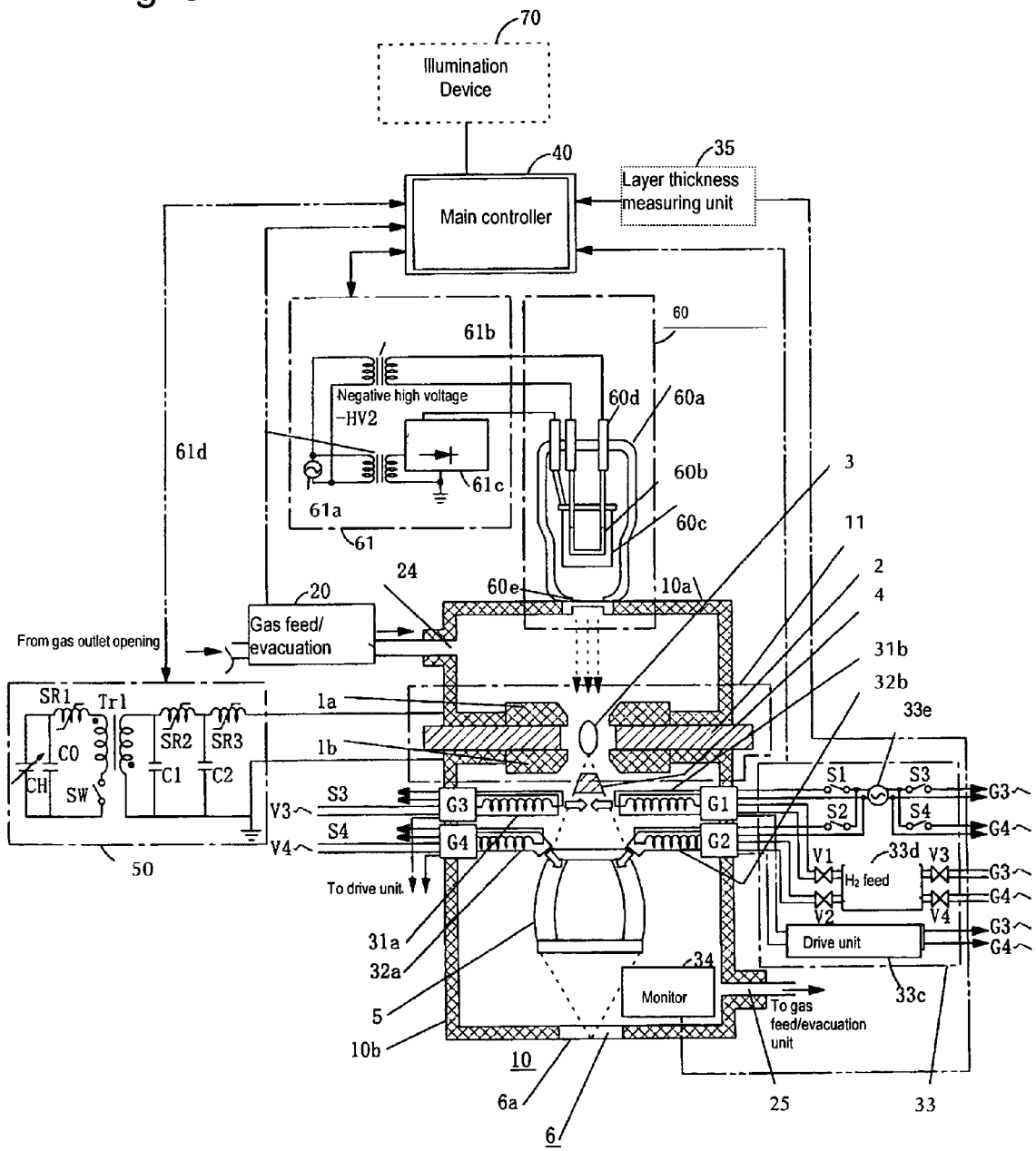
FIG. 5 is a schematic representation of the specific arrangement of a first embodiment of the EUV radiation source of the invention.

FIG. 5 schematically shows the specific arrangement of a first embodiment of the EUV radiation source according to the invention, in which a means for producing hydrogen radicals has been installed. FIG. 5 shows the same light source device as the EUV radiation source device of the DPP type which is shown in FIG. 3. The same parts as in FIG. 3 are provided with the same reference numbers as in FIG. 3 and are no longer further described.

As shown in FIG. 5, in a chamber 10 as the discharge vessel, a first ring-like main discharge electrode 1a (cathode) and a second ring like main discharge electrode 1b (anode) are arranged such that they clamp a ring-like insulating material 2. The electrodes 1a, 1b and the insulating material 2 are arranged, as was described above, such that the respective through openings are essentially coaxial. If a discharge forms between the electrodes 1a, 1b, high density and high temperature plasma is produced in this through opening or in its vicinity.

The chamber 10 is comprised of a first vessel 10a on the side of the electrode 1a and of a second vessel 10b on the side of the electrode 1b. The two vessels 10a, 10b are comprised of an electrically conductive component and are separated and insulated from one another by the insulating material 2. Here, the second vessel 10b of the chamber 10 and the electrode 1b are grounded.

Discharge gas is fed from a gas supply-evacuation unit 20 into the chamber by way of a gas supply opening 34 on the side of the first vessel 10a. Said discharge gas is a raw material gas which is used to form a radiating fuel for emitting EUV radiation with a wavelength of 13.5 nm with high efficiency in the generating part for high density and high temperature plasma of the EUV radiation generation part. Here, this gas is $SnH_4$.

The added $SnH_4$ flows in the chamber 10, is supplied to the EUV radiation generating part 11, and is used for plasma formation. That part of the raw material which has not contributed to plasma formation, and/or fragments and the like which are formed from the plasma, flow in the chamber 10 and travel to a gas outlet opening 25 which is located on the side of the second vessel 10b.

The gas supply-evacuation unit 20 has a gas evacuation means (not shown), such as a vacuum pump or the like, which is connected to the above described gas outlet opening. This means that the discharge gas which has reached the gas outlet opening is evacuated by the gas evacuation means of the gas supply-evacuation unit 20.

The pressure of the generating part 3 for high density and high temperature plasma is regulated to 1 Pa to 20 Pa. This pressure control takes place as follows:

First, the main controller 40 receives the pressure data which are sent from a pressure monitor (not shown) located in the chamber 10;

based on the received pressure data, the main controller 40 controls the gas supply-evacuation unit 20 and regulates the amount of $SnH_4$ gas supplied to the chamber 10 and the evacuation amount of $SnH_4$ gas; and the main controller 40 thus regulates the pressure of the generating part for high density and high temperature plasma to a given pressure.

Roughly −5 to −20 kV voltage from a high voltage pulse generating part 50 are applied to the vessel 10b and the electrode 1b as well as the vessel 10a and the electrode 1a which are grounded, as was described above. As a result, a high density and high temperature plasma discharge forms in the generating part 3 for high density and high temperature plasma between the electrodes 1a and 1b. EUV radiation with a wavelength of 13.5 nm is emitted from this plasma.

The emitted EUV radiation is focused by an EUV focusing mirror 5 which is located in the vessel 10b on the side of electrode 1b, as was described above, and emerges from an EUV radiation exit part 6 which has a wavelength selection means 6a to the irradiation part which constitutes an optical system (not shown) on the side of the exposure device. In this way, for example, EUV radiation with a wavelength of 13.5 nm emerges in the direction to the optical system on the side of the exposure device.

The EUV focusing mirror 5 has several mirrors which have the shape of an ellipsoid of rotation with different diameters or the shape of a paraboloid of rotation with different diameters, as was described above. These mirrors are arranged coaxially such that the center axes of rotation come to rest on one another so that the focal positions essentially agree with one another.

Figure 6:
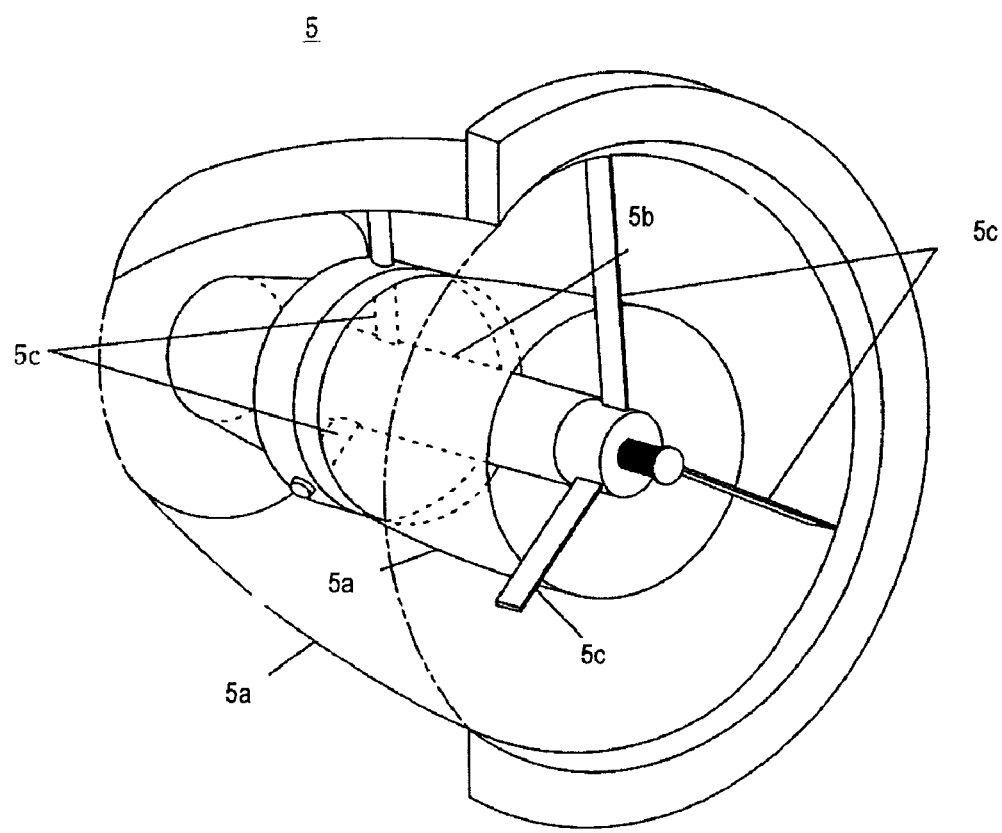
FIG. 6 is a schematic representation of the arrangement of one example of an EUV focusing mirror.

FIG. 6 schematically shows the arrangement of the above described EUV focusing mirror 5. FIG. 6 is a perspective in which part of the EUV focusing mirror 5 has been removed and which has been viewed from the EUV radiation exit side.

As FIG. 6 shows, the EUV focusing mirror 5 has several mirrors 5a (two in this example, but the number of mirrors can also be five to seven) in the shape of an ellipsoid of rotation or in the shape of a paraboloid of rotation, the cross-sectional shape in a section through the plane which contains the center axis (hereinafter called the "center axis of rotation") constituting an ellipsoid or a paraboloid. These mirrors 5a are arranged coaxially such that the center axes of rotation come to rest on one another so that the focal positions essentially agree with one another. At the position of this center axis of rotation, there is a hub-like central column 5b on which radial arms 5c are installed. The respective mirror 5a (the inside of the ellipsoid of rotation or paraboloid of rotation constitutes the mirror surface) are supported by the arms 5c. The central column 5b and radial arms 5c are located at positions at which the EUV radiation which is incident in the focusing mirror 5 and which emerges from is not obstructed by them as much as possible. For the mirrors 5a, thus the EUV radiation can be advantageously reflected by the reflection surface of the substrate material with a smooth surface, for example, of nickel (Ni) or the like, being precisely coated with a metal such as ruthenium (Ru), molybdenum (Mo), rhodium (Rh) or the like, as was described above.

In FIG. 5, as was described above, between the generating part 3 for high density and high temperature plasma and the EUV focusing mirror 5, there is a debris trap 4 which captures debris such a metal powder and the like, debris resulting from a radiating fuel such as tin or the like, and similar debris, and passes only EUV radiation. The above described debris, such as metal powder and the like, is produced by sputtering by the plasma.

The high voltage pulse generating part 50 comprises, for example, the following:

a two-stage magnetic pulse compression circuit of two magnetic switches SR2, SR3 of saturable reactors, a capacitor C1 and a capacitor C2.

The magnetic switch SR1 is used to reduce the switching losses in a solid state switch SW as a semiconductor switching device, such as an IGBT or the like. It is also called a magnetic assist.

Pulse compression operation in which the pulse width of the current pulse which is flowing on each stage is gradually reduced is carried out according to the transition of the energy stored by a charging device CH in the main capacitor CO by way of a transformer Tr1 of the magnetic pulse compression circuit. A high voltage pulse is applied between the electrodes 1a, 1b.

When a high voltage pulse is applied between the electrodes 1a, 1b, a creeping discharge forms on the surface of the insulating material 2 by which essentially a short circuit state is formed between the electrodes 1a, 1b by the resulting plasma. Thus, a pulsed large current flows between the electrodes 1a, 1b. Afterwards, a high temperature plasma forms in the generating part 3 for high density and high temperature plasma by Joulean heating as a result of the pinch effect of the intrinsic magnetic field by the large current of the plasma. EUV radiation with a wavelength of 13.5 nm is emitted from this plasma.

EUV radiation with a given repetition frequency takes place by repetitions of such a discharge operation by switching operation of the solid state switch SW and by high voltage power source operation.

Specific numerical values are shown below:

a discharge voltage of −20 kV is applied between the electrodes 1a, 1b;

roughly 10 J per pulse of energy with a frequency of a few kHz is applied between the electrodes 1a, 1b; and therefore a few dozen kW energy are supplied between the electrodes 1a and 1b.

As was described above, the pressure of generating part 3 for high density and high temperature plasma is regulated to 1 Pa to 20 Pa. At such a low pressure, depending on the electrode arrangement, a discharge forms with difficulty. As a result, there are also cases in which the intensity of the EUV radiation becomes unstable.

In order to produce a stable discharge in a situation in which a discharge forms with difficulty, it is desirable to carry out pre-ionization. Therefore, there is an pre-ionization unit 60 in the vessel 10a.

The pre-ionization unit 60 is, for example, an electron beam generating device as was proposed in Japanese patent application 2004-283527. The electron beam generating device described in JP HEI 10-512092 A (U.S. Pat. No. 5,612,588) can be used, for example, as an pre-ionization unit 60.

In the electron beam generating device which forms the pre-ionization unit 60, as shown in FIG. 5, in an insulating vessel 60a formed of an insulating component, such as glass or the like, there are a filament heater 60b as the electron beam source and a cathode 60c on which a terminal 60d for power supply is located and which projects to the outside from the insulating vessel 60a. The insulating vessel 60a is hermetically sealed and the inside is kept under a vacuum.

In the insulating vessel 60a, there is an electron beam transmission film 60e for transmission of electron beams. This beam transmission film 60e is electrically conductive and is installed directly in the first vessel 10a.

Current from a filament power source transformer 61b which is an insulating transformer which is connected to an AC power source 61a at the pre-ionization power source 61 is supplied to the filament heater 60b and the filament heater 60b is thus heated. Furthermore, a negative high voltage −HV2 is applied to the cathode from the insulating transformer 61d which is connected to the AC power source 61a by way of a boosting circuit 61c, such as a Cockcroft circuit or the like. Normally, the electron beams are extracted by the electron beam transmission film 60e having ground potential. The electron beams are emitted by way of the electron beam transmission film 60e, as is shown by the broken arrow in FIG. 5. Here, the electrode 1b on the side on which the EUV focusing mirror 5 and the like are located has a ground potential to prevent a discharge from forming between it and the EUV focusing mirror 5. Therefore, a negative high voltage −HV1 of few dozen kV is applied by the high voltage pulse generating part 50 to the electrode 1a and the vessel 10a. The electrical potential of the electron beam transmission film 60e therefore also reaches −HV1.

So that the electron beams can be effectively extracted, the negative high voltage −HV2 which is applied to the cathode 60c of the electron beam generating device is set such that |HV1|<|HV2|. Pre-ionization need not always take place using electron beams, but can also be carried out, for example, by UV radiation as a result of a surface discharge which forms in the chamber, as is described in JP 2003-218025 A (U.S. Pat. No. 6,894,298).

The EUV radiation source device of the DPP type which is shown in FIG. 5 and which is used as an exposure light source is operated as follows.

A stand-by signal is sent to the main controller 40 by the control element of an exposure device 70. When the stand-by signal is received, the main controller 40 controls the gas supply-evacuation unit 20, routes the discharge gas, for example, SnH$_4$ gas, from the gas supply opening 24 to the chamber 10 via the gas supply line which is located in the vessel 10a, and adjusts the gas pressure in the generating part 3 to a given pressure value. Next, an emission command is sent from the control element of the exposure device 70 to the main controller 40. The transmission interval of the emission commands is, for example, a few kHz.

When the emission command is received, the main controller 40 controls the pre-ionization power source 61, emits electron beams from the pre-ionization unit 60 in the direction to the generating part 3 for high density and high temperature plasma, thus carries out pre-ionization and moreover sends a trigger signal to the gate of the fixed switch SW of the high voltage pulse generating part 50. The solid state switch SW is moved into the ON state. A high voltage pulse is applied between the electrodes 1a, 1b. High temperature plasma from which EUV radiation with a wavelength of 13.5 nm is emitted forms in the generating part 3 for high density and high temperature plasma.

The EUV radiation which has been emitted from the plasma is reflected by the EUV focusing mirror 5 which is located in the vessel 10b on the side of the electrode 1b and emerges by way of the EUV radiation exit part 6 which has a wavelength selection means 6a, to an irradiation part which constitutes an optical system (not shown) on the side of the exposure device.

As was described above, in the EUV radiation source device shown in FIG. 5, there is a means for producing hydrogen radicals in order to remove the debris as a result of a radiating fuel such as tin or the like which form after EUV radiation, without its remaining within the EUV radiation source device or adhering to it.

The means for producing hydrogen radicals are hydrogen radical producing parts 31a, 31b which are arranged such that the emission direction of the hydrogen radicals crosses the outlet flow which contains debris, and radical producing parts 32a, 32b which are arranged such that the emission direction of the hydrogen radicals is opposite the surface of the EUV focusing mirror 5 on which tin and/or a tin compound has deposited. The radical producing parts 31a, 31b, 32a, 32b are each located in the space between the debris trap 4 and the EUV focusing mirror 5.

Figure 7:
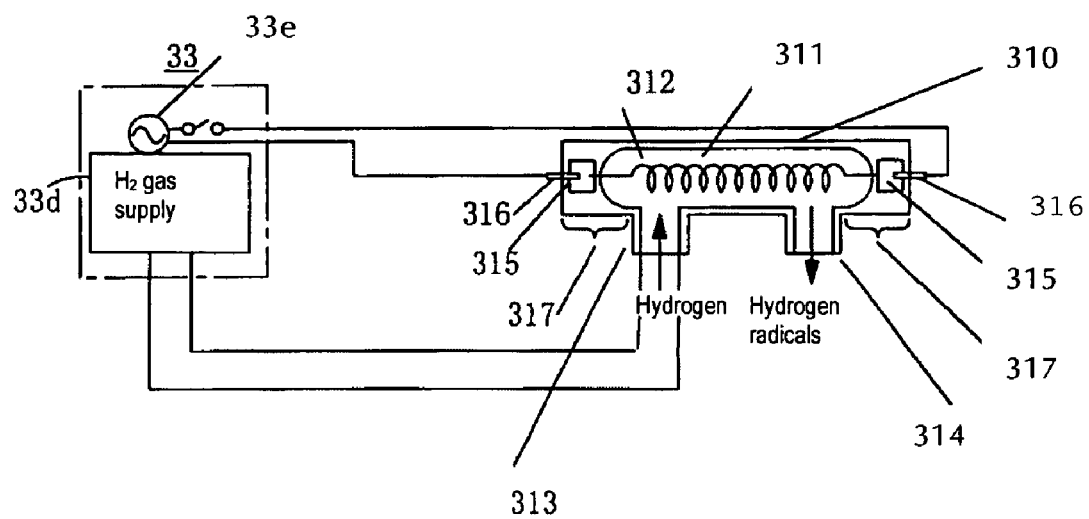
FIG. 7 is a schematic representation of the specific arrangement of one example of the area for producing hydrogen radicals.

FIG. 7 shows the specific arrangement of one example of the hydrogen radical producing parts. The hydrogen radical producing parts 31a, 31b, 32a, 32b, each have a flow reactor 310 in which a filament 312 is inserted into an inner reaction chamber 311.

In the vicinity of the two ends of the reaction chamber 311, there are a hydrogen gas feed tube 313 and a hydrogen radical outlet tube 314. The hydrogen gas feed tube 313 is connected to a H$_2$ gas supply unit 33b as the hydrogen supply source which has a drive control element 33. Hydrogen gas from this H$_2$ gas supply unit 33d is supplied by the hydrogen gas feed tube 313 to the reaction chamber 311 into which the filament 312 is inserted.

The filament 312 is made of tungsten (W) and has a diameter of roughly 0.4 mm. The two ends of the filament 312 are connected to metal foil ends 315, for example, of molybdenum (Mo) by welding or the like. Part of a metal rod is connected to the metal foil by welding or the like to the metal foil end 315 on the side which is opposite the side of connection to the end of the filament 312.

The metal foils, the ends of the filament 312 which are connected to the ends of these metal foils, and part of the metal rods 316 are sealed, for example, by hot welding and form seal areas 317. The end of the metal rod 316 on the side which is opposite the sealed side is connected to a heating power source 33e as an energy supply source which has a drive control element 33. This means that power is supplied to the tungsten filament 312 from the heating power source 33e.

If hydrogen gas is supplied in the state in which the reaction chamber 311, into which the filament 312 is inserted, and power is supplied from the heating power source 33e to the tungsten filament 312, the tungsten filament 312 is heated. The hydrogen molecules which come into contact with the tungsten filament 312 heated by energization dissociate and become hydrogen radicals.

Figure 8:
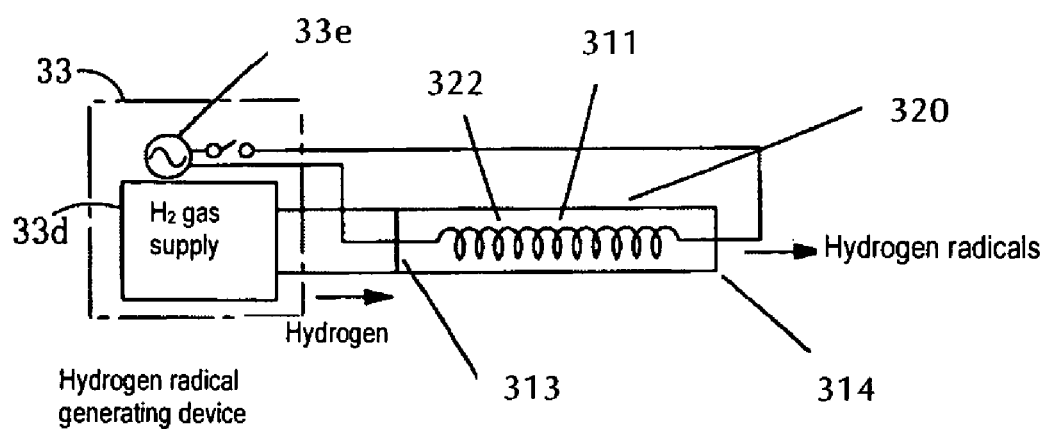
FIG. 8 is a schematic representation of the specific arrangement of another example of the area for producing hydrogen radicals.

The flow reactors which form the hydrogen radical producing parts 31*a*, 31*b*, 32*a*, 32*b* need not always have the sealed areas shown in FIG. 7, but can also be flow reactors 320 as shown in FIG. 8 with open ends.

The flow reactor 320 is a tube, for example, of silica glass with a diameter of 10 mm and a length of roughly 50 mm. In this case, the end of the tubular flow reactor 320 constitutes the hydrogen gas feed tube 313 which is connected to the $H_2$ gas supply unit 33*d*. This means that hydrogen gas is supplied from one end of the tubular flow reactor 320. The other end of the tubular flow reactor corresponds to the hydrogen radical outlet tube 314 as shown in FIG. 7. The cavity on the inside of the tubular flow reactor corresponds to the reaction chamber 311 into which a tungsten filament 322 with a diameter of roughly 0.4 mm has been inserted. The two ends of the tungsten filament 322 are connected to the heating power source 33*e*. Line installation on the side of the hydrogen gas feed tube of the tungsten filament 322 to the heating power source 33*e* takes place through a pipeline which connects the $H_2$ gas supply unit 33*d* to the hydrogen gas feed tube 313 being arranged continuously.

In this arrangement, the tungsten filament 322 is heated when hydrogen gas is supplied to the reaction chamber 311 into which the filament 312 is inserted, power is supplied from the heating power source 33*e* to the tungsten filament 322. The hydrogen molecules which come into contact with the tungsten filament 322 heated by energization dissociate, become hydrogen radicals and are emitted from the open end 314. For the arrangement of the hydrogen radical producing part shown in FIG. 8, there is no sealing area. It can be more easily produced than the one according to FIG. 7. Production costs are also reduced.

In FIG. 5, the ends on the hydrogen radical emission sides of the radical producing parts 31*a*, 31*b*, 32*a*, 32*b* and the ends on the opposite sides are each connected to the drive devices G1, G2, G3, G4 which are driven by a drive unit 33*c* as the driver which the drive control element 33 has, and which move the radical producing parts 31*a*, 31*b*, 32*a*, 32*b* to the right/left and up/down as shown in FIG. 5. The areas of the drive devices G1, G2, G3, G4 which are connected to the vessel 10*b* comprising the chamber 10 are kept sealed.

The respective filament of the radical producing parts 31*a*, 31*b*, 32*a*, 32*b*, as is shown in FIGS. 7 and 8, is connected by way of the switches S1, S2, S3, S4 to the heating power source 33*e* which has the drive control element 33.

The line of the respective filament is laid to the heating power source 33*e*, for example, by way of a field through part (not shown) and which is provided in each of the drive devices G1, G2, G3, G4 and in which the power source can be connected while maintaining the sealing action. The sealing action of the vessel 10*b* is therefore not adversely affected by line installation.

The radical producing parts 31*a*, 31*b*, 32*a*, 32*b* are each connected via valves V1, V2, V3, V4 to the $H_2$ gas supply unit 33*d* which the drive control element 33 has. The pipeline arrangement of the respective radical producing part with the $H_2$ gas supply unit 33*d* takes place as in the above described electrical line installation, for example, by way of "field through parts" which are located in the drive devices G1, G2, G3, G4 (not shown). The sealing action of the vessel 10*b* is therefore not adversely affected by the pipeline arrangement. The pipeline is routed, for example, out of a flexible tube made of a metallic bellows. In the case in which the radical producing parts 31*a*, 31*b*, 32*a*, 32*b* are moved to the right/left and up/down as shown in FIG. 5 by the drive devices G1, G2, G3, G4, the degree of freedom of motion is not adversely affected by the pipeline.

The drive control element 33 is controlled by the main controller 40. The supply of hydrogen gas to the radical producing parts 31*a*, 31*b*, 32*a*, 32*b* is controlled by switching control of the valves V1, V2, V3, V4 based on the command signals of the main controller 40.

Likewise power is supplied to the radical producing parts 31*a*, 31*b*, 32*a*, 32*b* by switching control of the switches S1, S2, S3, S4. The radical producing parts 31*a*, 31*b*, 32*a*, 32*b* are positioned by position control by the drive unit 33*c* based on a positioning signal from the main controller 40.

According to this embodiment, between the debris trap 4 and the EUV focusing mirror the hydrogen radical producing parts 31*a*, 31*b* are arranged such that the outlet flow which contains the debris crosses the emission direction of the hydrogen radicals. Therefore, it became possible to react Sn (tin), $Sn_x$ metallic clusters, fragments of $SnH_x$ and the like, which are in the gaseous phase state and have passed through the debris trap 4, with hydrogen radicals, to form gaseous tin hydride with a high vapor pressure (for example, $SNH_4$), and to evacuate the product by the evacuation means. This means that it has become possible to reduce fine tin particles and tin clusters which travel to the EUV focusing mirror or the like. In particular, the arrangement of several radical producing parts 31*a*, 31*b* has enabled the hydrogen radicals to be reacted with the debris as a result of tin with high efficiency.

Furthermore, since the hydrogen radical producing parts 32*a*, 32*b*, between the debris trap 4 and the EUV focusing mirror 5, are arranged such that the emission direction of the hydrogen radicals is opposite the surface of the EUV focusing mirror on which the tin and/or tin compound has deposited, it became possible to react tin and/or a tin compound which has deposited on the EUV focusing mirror 5 with hydrogen radicals, to form gaseous tin hydride with a high vapor pressure (for example, $SnH_4$) and to evacuate it by an evacuation means. This means that it became possible to clean the EUV focusing mirror.

In particular, the arrangement of several radical producing parts 32*a*, 32*b* enabled tin and/or a tin compound which has deposited on the surface of EUV focusing mirror 5 to be reacted with hydrogen radicals with high efficiency.

The positions of the radical producing parts 31*a*, 31*b*, 32*a*, 32*b*, can each be controlled. Therefore, they can be located in the space between the debris trap 4 and the EUV focusing mirror 5 which is outside the optical path in which the EUV radiation is incident on the EUV focusing mirror 5. Therefore, it became possible to emit hydrogen radicals even during operation of the EUV radiation source device without adversely affecting the focusing effect.

Not all the radical producing parts 31*a*, 31*b*, 32*a*, 32*b*, need be arranged as was described above, but, for example, only the radical producing parts 31*a*, 31*b* or the radical producing parts 32*a*, 32*b* can be used. In these cases, the effect of the debris resulting from a radiating fuel such as tin or the like can be suppressed even more compared to the conventional example.

In the EUV radiation source device shown in FIG. 5, a reaction test with hydrogen radicals was run. The material for supply of the EUV radiating fuel was $SnH_4$ gas and discharge took place for about 60 minutes in the EUV generation part. During the discharge, there was no hydrogen radical emission from the radical producing parts 31*a*, 31*b*, 32*a*, 32*b*. It was found, based on the determination result of the monitor unit that, roughly 5 μm of tin and/or a tin compound deposited on the EUV focusing mirror 5.

After completion of the discharge, hydrogen radicals were emitted from the radical producing parts 32*a*, 32*b* in the direction to the EUV focusing mirror 5. Here, the supply amount of hydrogen gas to the radical producing parts 32a, 32b was at a flow rate of approximately $1 \times 10^{-4}$ m$^3$/min (25° C.), 1 atom. Heating by energization was carried out such that the filament temperature reached roughly 1800° C. The internal chamber pressure was kept at 100 Pa. The temperature of the EUV focusing mirror 5 was kept essentially at room temperature.

The surface of the EUV focusing mirror after roughly 50 minutes of generation of hydrogen radicals was analyzed using x-ray-photoelectron spectroscopy (XPS). The residual amount of tin was less than or equal to the determination limit (0.1 at –%). Furthermore, molybdenum (Mo) which was not visible before irradiation and which covers the outermost surface layer of the EUV focusing mirror 5 was identified. The rate of tin elimination here presumably was at least 2 nm/sec.

Based on the above described results, it was demonstrated that by feeding hydrogen radicals to the surface of the EUV focusing mirror on which tin and/or a tin compound had deposited, tin and/or a tin compound can be effectively eliminated. Furthermore, it was found by detailed analysis that molybdenum which covers the outermost surface layer of the EUV focusing mirror was not damaged at all.

The process for producing hydrogen radicals is not limited to the above described thermocatalyst method in which the filament is heated in hydrogen gas and hydrogen radicals are produced, but a plasma generation method can also be undertaken in which hydrogen radicals are produced using microwave plasma or high frequency plasma.

The two methods for eliminating tin and/or a tin compound which has deposited on the surface of the EUV focusing mirror were used and compared to one another. In the thermocatalyst method, the tin and/or a tin compound which had deposited on the surface of the EUV focusing mirror was eliminated in a shorter time than when using the plasma generation method.

The reason for this is not always clear. However, it can be postulated that the reason is that, in the thermocatalyst method as compared to the plasma generation method, the degree of hydrogen gas utilization is higher and that, in the thermocatalyst method, hydrogen radicals were produced by roughly 1 to 2 powers more. Furthermore, it can be imagined that influences are also exerted by the fact that the translational energy of the hydrogen radicals is high in the thermocatalyst method and that moreover oscillation-excited hydrogen molecules are also contained.

In the plasma generation method, a plasma discharge electrode, a microwave generating means, a high frequency generating means and the like are necessary, by which a large generating device is required. In the thermocatalyst method, there is therefore also the advantage that compared to the plasma generation method the arrangement is simpler and more economical.

Version of the First Embodiment

The EUV device according to the first embodiment is not limited to the device which is shown in FIG. 5, but allows different versions.

Figure 9:
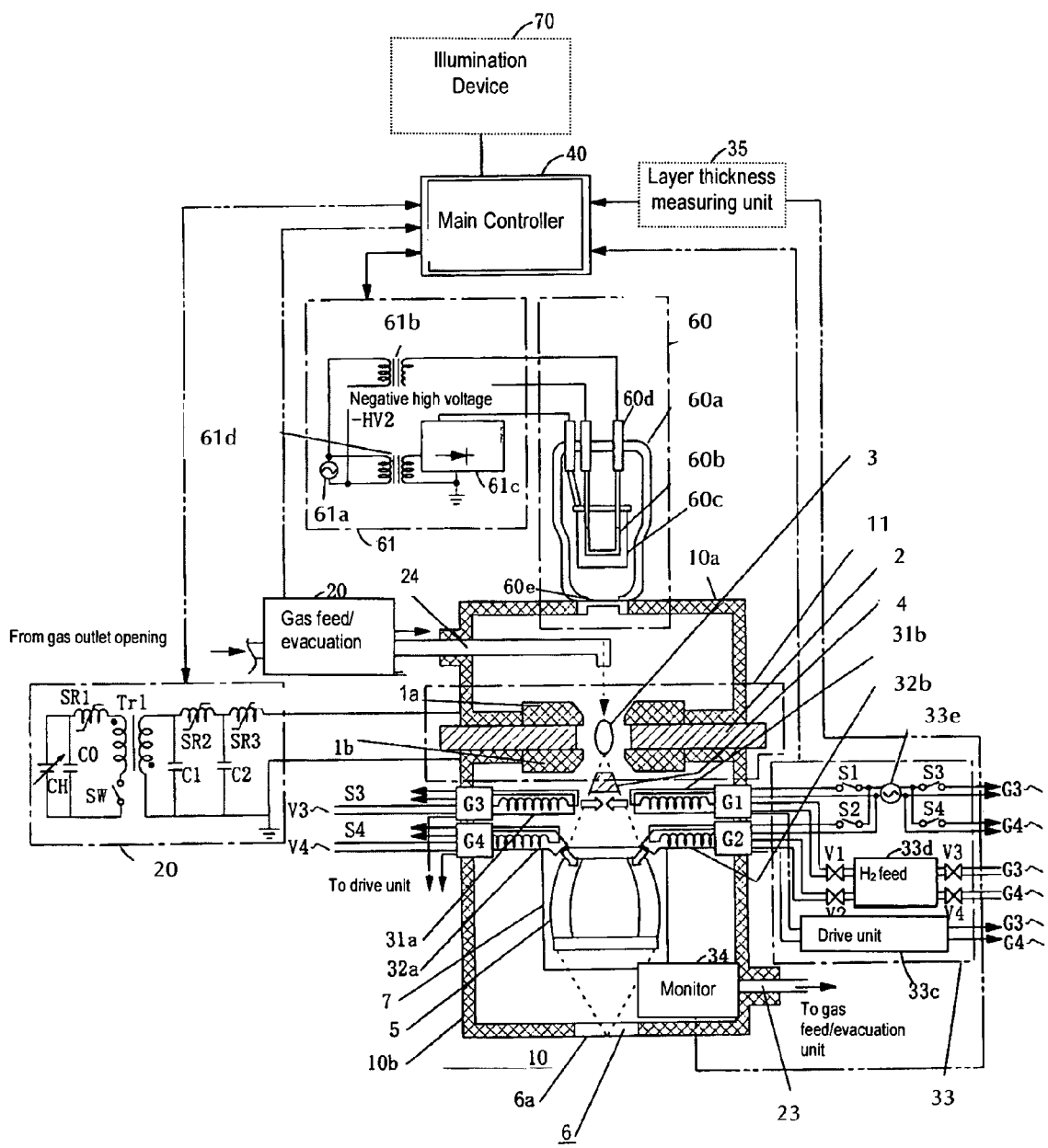
FIG. 9 is a schematic representation of the arrangement of one example of the protective hydrogen radical diffusion wall in a first embodiment.

For example, as shown in FIG. 9, there can be a protective radical diffusion wall 7 with which the EUV focusing mirror 5 and the hydrogen radical outlet tubes of the radical producing parts 32s, 32b are surrounded. This protective radical diffusion wall 7 is formed, for example, of an insulating material, such as silica glass, a ceramic or the like, and is cylindrical. The arrangement of such a protective radical diffusion wall 7 can increase the density of the hydrogen radicals in the vicinity of the surface of the EUV focusing mirror 5, which radicals are emitted from the radical producing parts 32a, 32b. It was found by the research of the inventors that the arrangement of the protective radical diffusion wall 7 was able to increase at least by a factor of 1.5 the rate of elimination of tin and/or a tin compound which had deposited on the surface of the EUV focusing mirror 5 as compared to the case of the absence of a protective radical diffusion wall 7.

Furthermore, in the first embodiment, hydrogen gas can be supplied to the generating part 3 for high density and high temperature plasma from the gas supply-evacuation unit 20 instead of the raw material (for example, SnH$_4$), a discharge can be produced between the electrodes 1a, 1b, and hydrogen radicals can be produced. In this case, it becomes possible to also remove the tin and tin compound which has adhered in the vicinity of the opening of the insulating material 2 from that region.

Furthermore, if feed of hydrogen radicals from the radical producing parts 32a, 32b to the EUV focusing mirror 5 or the like is also used, the density of the hydrogen radicals in the EUV focusing mirror 5 is increased even more, by which prompt elimination of tin and/or a tin compound which has deposited on the EUV focusing mirror 5 is enabled. The research of the inventors made it possible to increase by a factor of 1.2 the rate of elimination of tin and/or a tin compound which had deposited on the surface of the EUV focusing mirror 5 as compared to the case of only radical generation in the radical producing parts 32a, 32b, by concomitant use of a hydrogen discharge and radical generation in the radical producing parts 32a, 32b.

(2) Second Exemplary Embodiment

Figure 10:
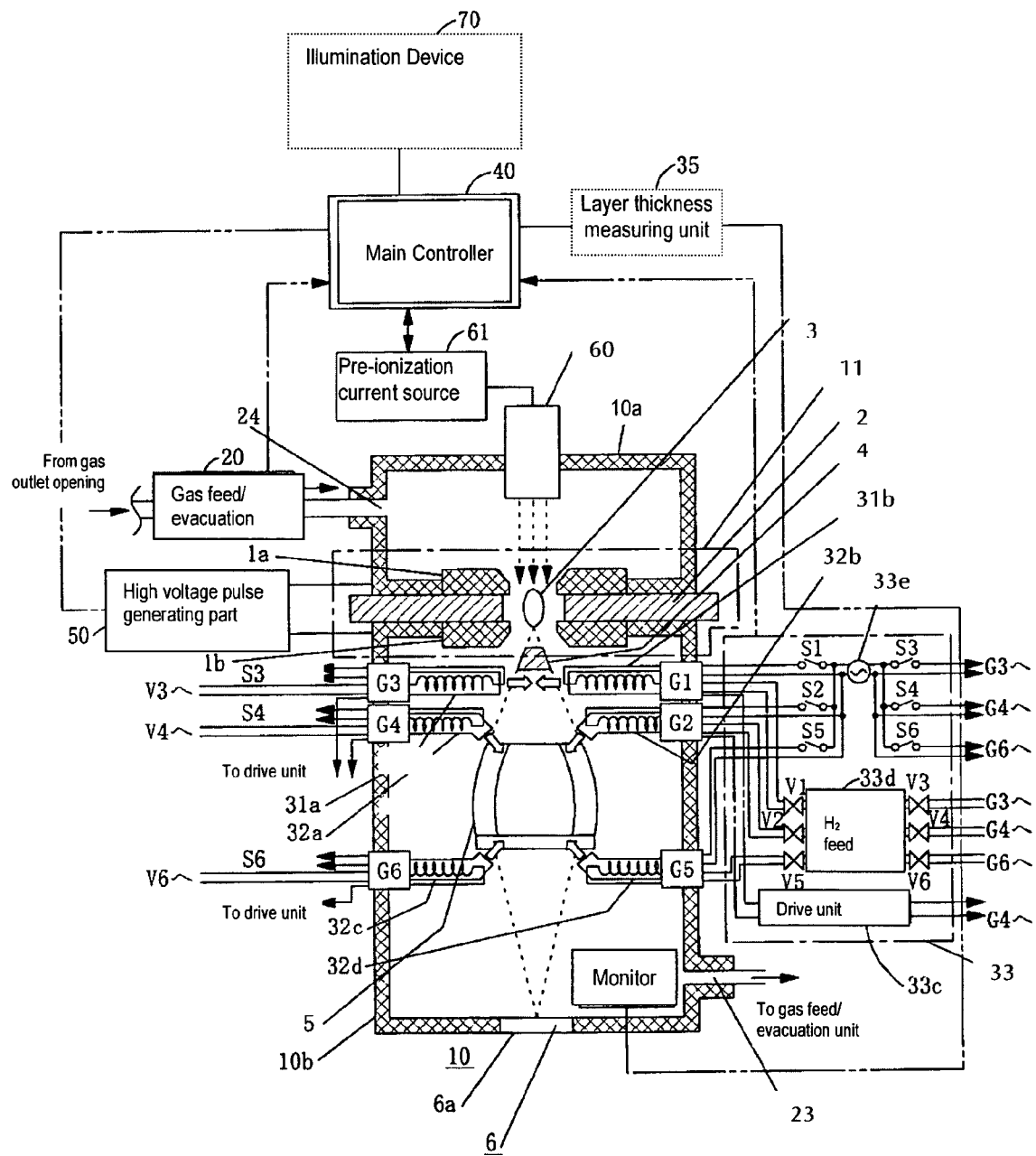
FIG. 10 is a schematic representation of the specific arrangement of a second embodiment of the EUV radiation source of the invention.

FIG. 10 shows the specific arrangement of a second exemplary embodiment of the EUV radiation source in accordance with the invention in which a means for producing hydrogen radicals has been installed. Here, as in FIG. 3 and FIG. 5, an EUV radiation source device of the DPP type is shown. The same parts as in FIGS. 3 & 5 are provided with the same reference numbers and are not further described.

In this embodiment, unlike the arrangement shown in FIG. 5 according to the first embodiment, there are radical producing parts 32c, 32d on the EUV radiation exit side of the EUV focusing mirror 5.

The radical producing parts 32c, 32d are arranged on the EUV radiation exit side of the EUV focusing mirror 5 such that the emission direction of the hydrogen radicals is opposite the surface of the EUV focusing mirror 5 on which the tin and/or tin compound has deposited. The radical producing parts 32c, 32d, like the radical producing parts 32a, 32b, have an arrangement in which hydrogen radicals are emitted from the open end which is shown in FIG. 8.

The ends on the side which are opposite the ends on the hydrogen radical emission side of the radical producing parts 32c, 32d are each connected to drive devices G5, G6 which are driven by a drive unit 33c as a driver which the drive control element 33 has, which devices move the radical producing parts 32c, 32d to the right/left and up/down as shown in FIG. 5. The areas of the drive devices G5, G6 which are connected to the vessel 10b comprising the chamber 10 are kept sealed.

The respective filament of the radical producing parts 32c, 32d is connected by way of the switches S5, S6 to the heating power source 33e which the drive control element 33 has.

The line of the respective filament is laid to the heating power source 33e, for example, by way of a "field through part" (not shown) and which is provided in each of the drive devices G5, G6. The sealing action of the vessel 10b is therefore not adversely affected by the line installation.

The radical producing parts 32c, 32d are each connected via valves V5, V6 to the $H_2$ gas supply unit 33d which the drive control element 33 has. The pipeline arrangement of the respective radical producing part with the $H_2$ gas supply unit 33d takes place as in the above described electrical line installation, for example, by way of "field through parts" which are located in the drive devices G5, G6 (not shown). The sealing action of the vessel 10b is therefore not adversely affected by the pipeline arrangement.

The above described pipeline is routed, for example, out of a flexible tube made of a metallic bellows. In the case in which the radical producing parts 32c, 32d, are moved to the right/left and up/down as shown in FIG. 10 by the drive devices G5, G6, the degree of freedom of motion is not adversely affected by the pipeline.

The supply of hydrogen gas to the radical producing parts 32c, 32d is controlled by switching control of the valves V5, V6 based on the command signals of the main controller 40.

Likewise, power is supplied to the radical producing parts 32c, 32d by switching control of the switches S5, S6. The radical producing parts 32c, 32d are positioned by position control by the drive unit 33c based on a positioning signal from the main controller 40.

The arrangement and the operation and the like of the above described radical producing parts are identical to those according to the first embodiment so that they are not further described.

In this embodiment, the same action as in the first embodiment can be obtained. Furthermore, the arrangement of the radical producing parts 32c, 32d, on the EUV radiation exit side of the EUV focusing mirror 5 such that the emission direction of the hydrogen radicals is opposite the surface of the EUV focusing mirror 5 on which the tin and/or tin compound has deposited enables tin and/or a tin compound which has deposited on the EUV focusing mirror to be reacted with hydrogen radicals with higher efficiency.

This means that the arrangement of the radical producing parts 32a, 32b, and radical producing parts 32c, 32d, each above and below the EUV focusing mirror 5 has made it possible to clean the EUV focusing mirror almost twice as fast as in the first embodiment.

The positions of the radical producing parts 32c, 32d, like the radical producing parts 31a, 31b, 32a, 32b, can each be controlled. Therefore, they can be located in the lower space of the EUV focusing mirror, and moreover, outside the focusing area. Therefore, even during operation of the EUV radiation source device hydrogen radicals can be emitted without adversely affecting the focusing effect.

(3) Third Embodiment

Figure 11:
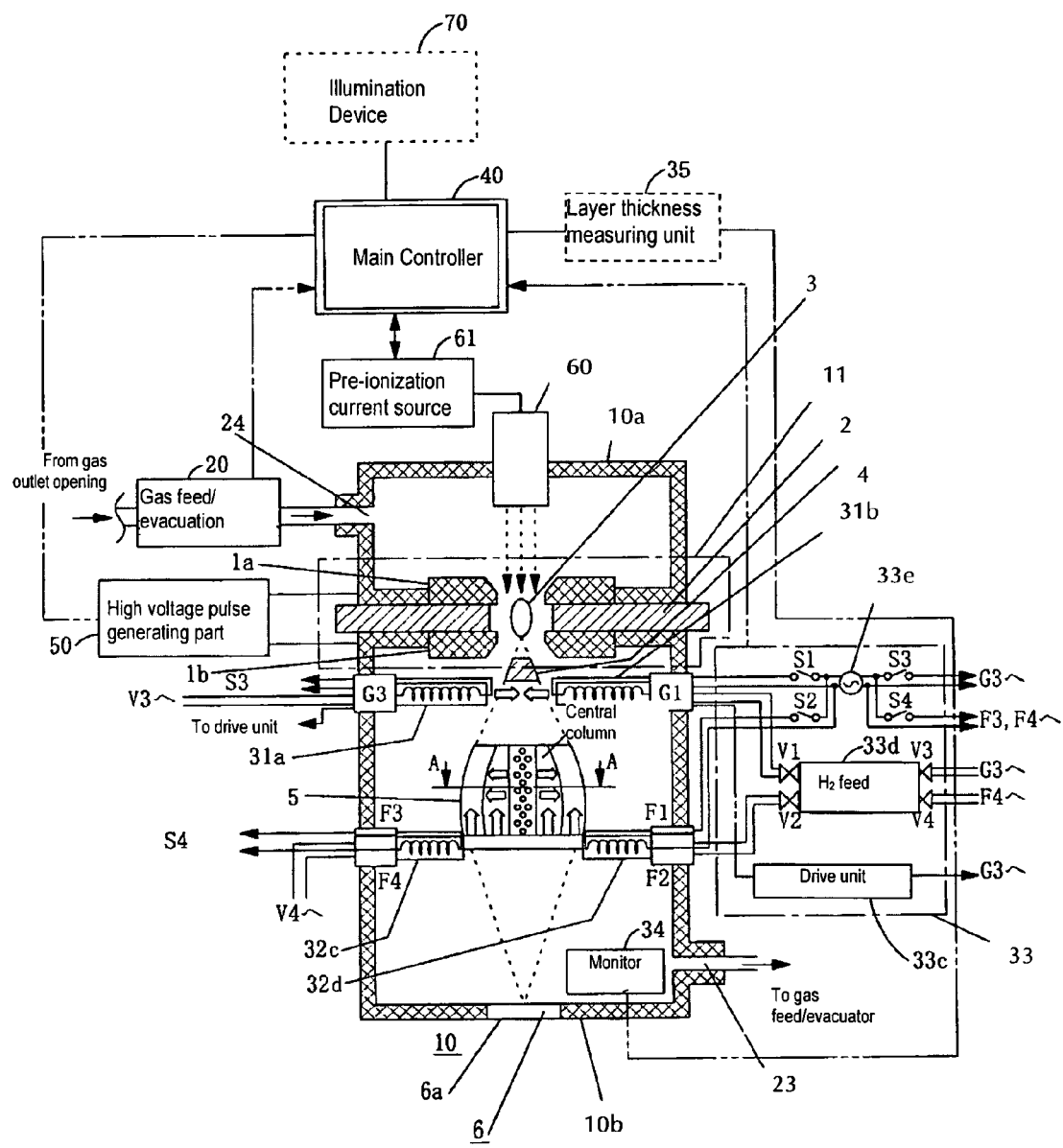
FIG. 11 is a schematic representation of the specific arrangement of a third embodiment of the EUV radiation source in accordance with the invention.

FIG. 11 shows the specific arrangement of a third exemplary embodiment of the EUV radiation source of the invention in which a means for producing hydrogen radicals has been installed. Here, as in FIGS. 3 & 5, an EUV radiation source device of the DPP type is shown. The same parts as in FIGS. 3 & 5 are provided with the same reference numbers and are not further described.

In this embodiment, the following are done:

The radial arm 5c, which is arranged for supporting the mirror 5a of the EUV focusing mirror 5 which shown above in FIG. 6, is formed as a cavity;

there are several openings in the radial arms 5c (FIGS. 12(a) & 12(b));

the radial arms 5c are coupled to the radical producing parts;

hydrogen radicals are routed into the cavity of the radial arms 5c; and the hydrogen radicals from the above described openings are supplied to the reflection surface of the EUV focusing mirror 5.

As was described above, the EUV focusing mirror 5 has several mirrors in the form of ellipsoids of rotation with different diameters or in the form of paraboloids of rotation with different diameters. These mirrors 5a are arranged coaxially such that the center axes of rotation come to rest on one another so that the focal positions essentially agree with one another. These several mirrors have a central hub 5b and radial arms 5c in order to maintain a multiple arrangement in which they are arranged coaxially such that the center axes of rotation come to rest on one another so that the focal positions essentially agree with one another, as was described above.

FIG. 12(a) shows the arrangement of one example of the EUV focusing mirror used in this exemplary embodiment and is a cross section cut along line A-A of the EUV focusing mirror shown in FIG. 11.

In the example shown in FIG. 12(a), the EUV focusing mirror 5 has two mirrors in the form of an ellipsoid of rotation with different diameters or in the form of a paraboloid of rotation with different diameters. These mirrors 5a-1 (inside mirror) and 5a-2 (outside mirror) are, as was described above, arranged coaxially such that the center axes of rotation come to rest on one another so that the focal positions essentially agree with one another. The inside and the outside mirrors 5a-1 and 5a-2 are fixed and positioned by a radial arm 5c which is mounted in the central hub 5b, by which the above described double arrangement is maintained.

The radial arm 5c inside has a cavity 5e as is shown using the cross section in FIG. 12(b) and is provided with several openings 5d which are provided in the radial arm 5c at points by which the reflection surface of the inside mirror 5a-1 and the reflection surface of the outside mirror 5a-2 can be seen through. One partial end of the radial arm 5c has openings (not shown) and to which the hydrogen radical emission tubes of the radical producing parts 32c, 32d which are shown in FIG. 11 are connected. The ends of the radial arms 5c to which the radical producing parts 32c, 32d are not connected have a closed arrangement.

As in the radial arm 5c, the inside of the central hub 5b which is located at the position which essentially agrees with the optical axis of the EUV focusing mirror 5 can be provided with a cavity and there can be several openings as in FIG. 11. The cavity located in the central hub 5b is connected to the cavity of the radial arm 5c. The several openings of the central hub 5b are located at points which are opposite the reflection surface of the inside mirror of the central hub 5b.

In FIG. 11, the radical producing parts 32c, 32d are connected to the EUV focusing mirror 5 and, as was described above, are fixed in the vessel 10b.

The respective filament of the radical producing parts 32c, 32d is connected by way of the switches S2, S4 to the heating power source 33e which the drive control element 33 has.

The line of the respective filament is laid to the heating power source 33e by way of "field through parts" F1, F2, F3, F4 which are located on the wall of the vessel 10b. The sealing action of the second vessel is therefore not adversely affected by line installation.

The radical producing parts 32c, 32d are each connected via valves V2, V4 to the $H_2$ gas supply unit 33d which the drive control element 33 has. The pipeline arrangement of the respective radical producing part with the $H_2$ gas supply unit 33d also takes place as in the above described electrical line installation by way of "field through parts" F2, F4. The sealing action of the vessel 10b is therefore not adversely affected by the pipeline arrangement.

The supply of hydrogen gas to the radical producing parts 32c, 32d is controlled by switching control of the valves V2, V4 based on command signals of the main controller 40. Power is supplied to the radical producing parts 32c, 32d likewise by switching control of the switches S2, S4.

Since the arrangement, the operation and the like of the radical producing parts 31a, 31b, 32c, 32d, are identical to those in the first embodiment, they are not further described.

As was described above, in this embodiment, an EUV focusing mirror 5 with a multiple arrangement is used in which several mirrors in the form of ellipsoids of rotation with different diameters or in the form of a paraboloids of rotation with different diameters are arranged coaxially such that the center axes of rotation come to rest on one another so that the focal positions essentially agree with one another. In an EUV focusing mirror with this general arrangement, the radial arms 5c (or the radial arms 5c and the central hub 5b) which positions and fixes the above described several mirrors has a cavity arrangement, and there are several openings at locations of the arms which are opposite the reflection surfaces of the above described several mirrors. The cavity of the radial arm 5c with such an arrangement is connected to the radical producing parts 32c, 32d. The hydrogen radicals emitted from them are supplied to the above described cavity. Hydrogen radicals are emitted from the openings at the points which are opposite the reflection surfaces of the above described several mirrors.

The above described arrangement makes it possible to supply hydrogen radicals from positions in the vicinity of the reflection surfaces of the mirrors. The diffusion of the hydrogen radicals as far as reaching the reflection surfaces of the mirrors is also suppressed. This makes it possible to carry out the reaction of tin and/or a tin compound which has deposited on the surface of the EUV focusing mirror with hydrogen radicals with higher efficiency than in the above described exemplary embodiment. It has become possible to quickly form gaseous tin hydride (for example $SnH_4$) with a high vapor pressure and to evacuate it by an evacuation means. This means that it has become possible to clean the EUV focusing mirror within a short time.

In particular, an enhancement of the above described action was enabled by the measure that in the middle area of the radial arm which essentially agrees with the optical axis of the EUV focusing mirror, there is, for example, a cylindrical central hub with an internal cavity, which is connected to the cavity of the above described radial arms, and in which there are several openings at locations which are opposite the reflection surfaces of the inside mirror.

Hydrogen radicals are supplied using the EUV focusing mirror by the radial arm and a central hub which have the above described arrangements. The rate of elimination of tin and/or a tin compound which have deposited on the EUV focusing mirror was increased even more by greater than or equal to 1.5 times compared to the first embodiment.

(4) Fourth Embodiment

Figure 13:
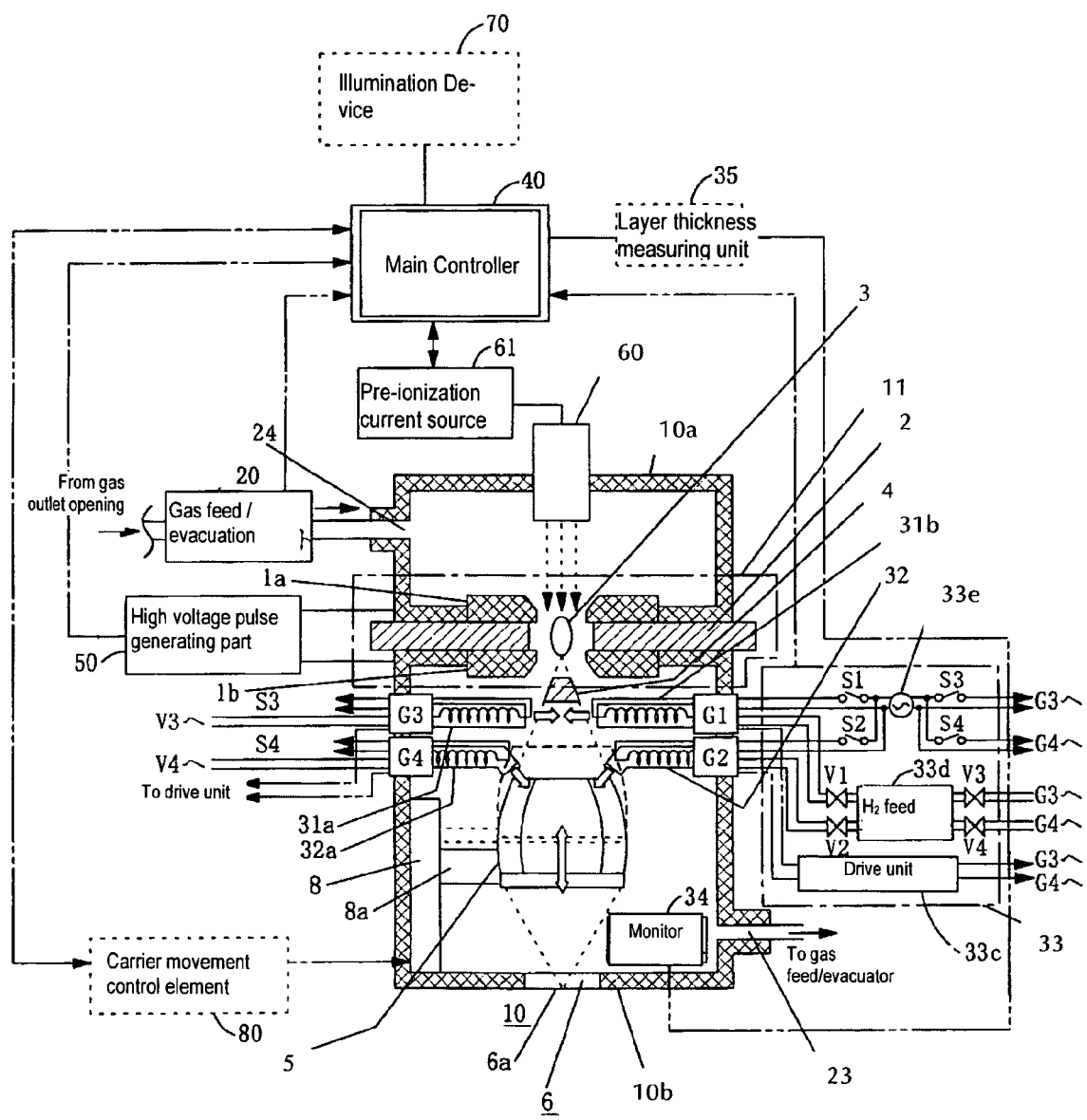
FIG. 13 is a schematic representation of the specific arrangement of a fourth embodiment of the EUV radiation source as of the invention.

FIG. 13 shows the specific arrangement of a fourth exemplary embodiment of the EUV radiation source in accordance with the invention in which a hydrogen radical production means has been installed. Here, as in FIGS. 3 & 5, an EUV radiation source device of the PP type is shown. The same parts as in FIG. 3 are provided with the same reference numbers and are not further described.

This exemplary embodiment is a version of the first embodiment. In the EUV radiation source device shown in the first exemplary embodiment, the radical producing parts with positions which can be controlled are positioned at locations at which the EUV radiation emitted by the high density and high temperature plasma does not screen the optical path which is incident in the EUV focusing mirror. Therefore, it has become possible to emit hydrogen radicals even during operation of the EUV radiation source device without adversely affecting the focusing effect.

In this exemplary embodiment, it is mainly a matter of debris treatment by the hydrogen radicals during an interruption of the EUV radiation source device.

For example, in an arrangement of the radical producing parts outside of the optical path of the EUV radiation which is incident in the EUV focusing mirror and which is emitted by the high density and high temperature plasma, there are cases in which the number of hydrogen radicals routed from the radical producing parts to the EUV focusing mirror is not always sufficient.

In this case, it is necessary to move the radical producing parts such that the radical producing parts and the EUV focusing mirror are caused to approach one another. In doing so, the radical producing parts are located at points at which the EUV radiation which is incident in the EUV focusing mirror is partially screened. Treatment by the hydrogen radicals in this arrangement is thus carried out during an interruption in the operation of the EUV radiation source device.

Furthermore, in an EUV radiation source device, depending on the specification of the device, it is necessary to shorten the distance between the generating part for high density and high temperature plasma which emits the EUV radiation, and the EUV focusing mirror to a certain extent in order for more EUV radiation from the generating part for high density and high temperature plasma to be captured with the EUV focusing mirror. Then, there are also cases in which the arrangement of the radical producing parts in space between the debris traps and the EUV focusing mirror becomes difficult.

In this case, during an interruption of the EUV radiation source device, it is necessary to move not only the radical producing parts, but also the EUV focusing mirror and to carry out treatment by the hydrogen radicals.

In view of the above described circumstances, in the fourth embodiment, as shown in FIG. 13 of the EUV radiation source device shown in FIG. 5 according to the first exemplary embodiment, an arrangement for position control by movement of the EUV focusing mirror was added.

In FIG. 13 the EUV focusing mirror 5 is connected to a movement part 8a of a movement carrier 8. The movement carrier 8 is subject to position control by a movement carrier control element 80 with a driver for movement. In this exemplary embodiment, when a positioning signal which was sent by the main controller 40 is received, the movement carrier 8 is driven by the movement carrier control element 80 and position control of the EUV focusing mirror 5 is produced. The movement carrier 8 moves, for example, in three-dimensional directions, i.e., up/down, right/left and in the direction perpendicular to the page of the drawing in FIG. 13. Furthermore, the EUV focusing mirror 5 can be turned around a direction to the right/left or around a direction which is perpendicular to the page of the drawing and can change its inclination.

The arrangement, the operation and the like of the radical producing parts 31*a*, 31*b*, 32*a*, 32*b* are identical to the first exemplary embodiment and are therefore not further described.

Figure 14:
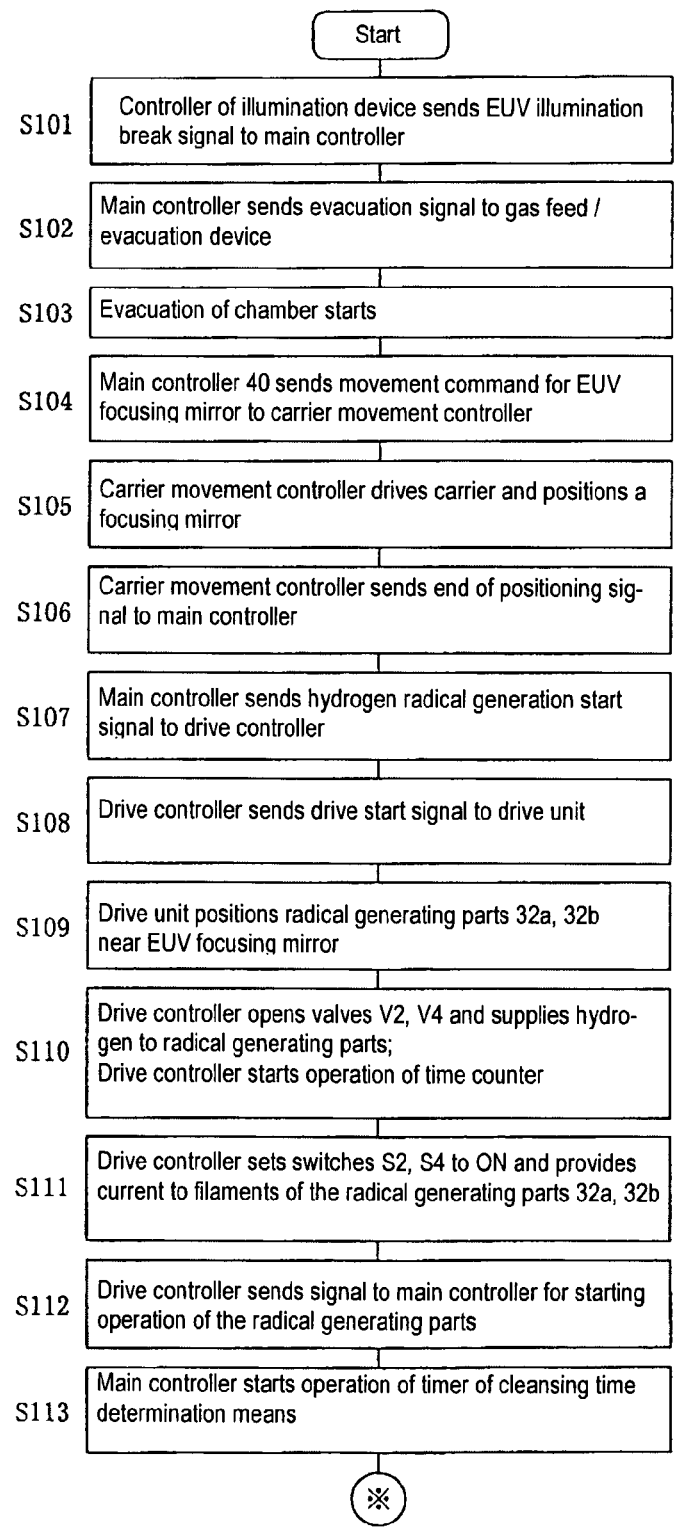
FIG. 14 is the first half of a flow chart of one example of a cleaning treatment with hydrogen radicals in the fourth embodiment.
Figure 15:
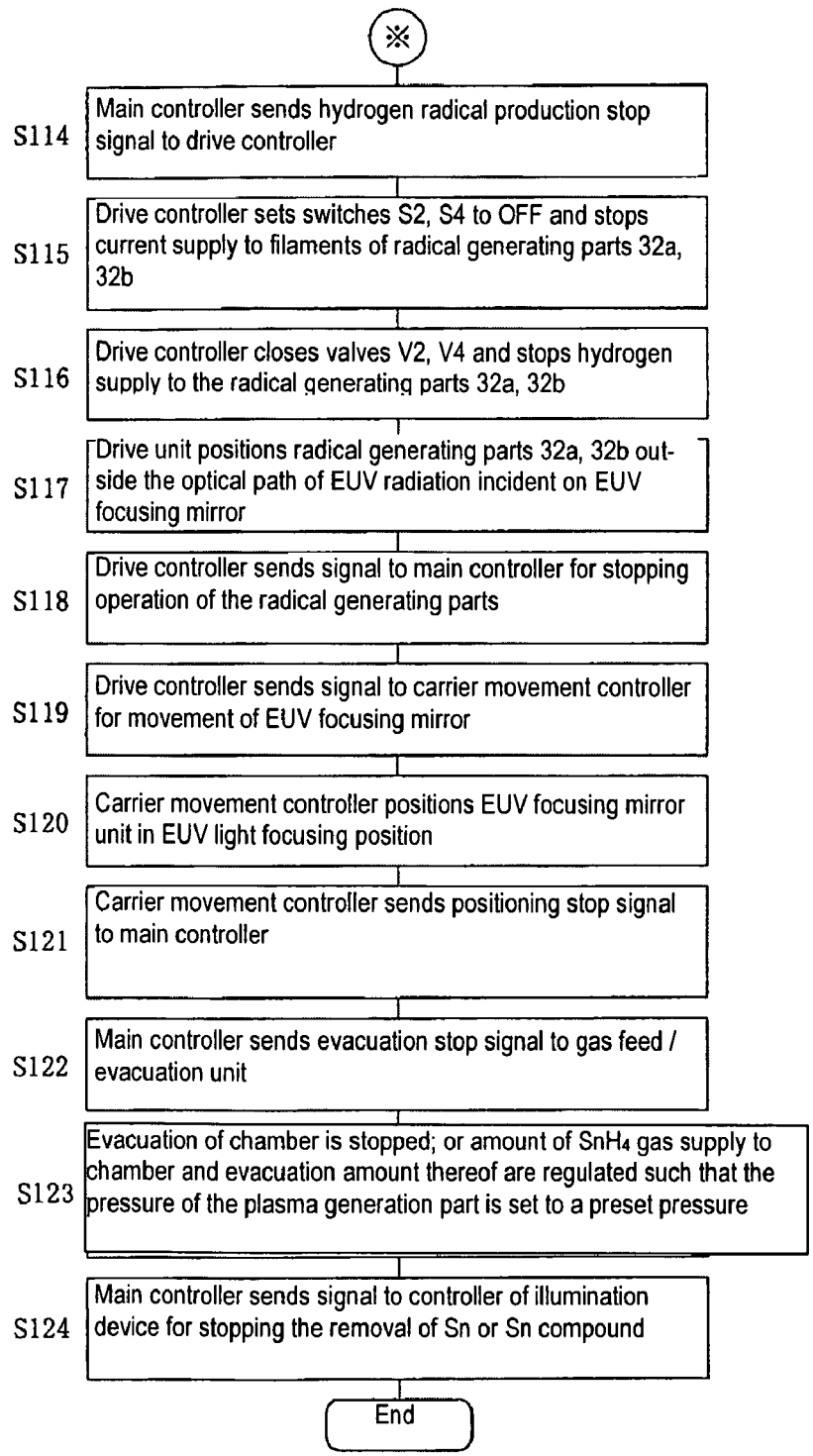
FIG. 15 is a the second half of the flow chart showing an example of the cleaning treatment with hydrogen radicals in the fourth embodiment.

FIGS. 14 & 15 are flow charts of an example of cleaning treatment by hydrogen radicals in this exemplary embodiment. This treatment is carried out, for example, as follows.

An EUV radiation interruption signal is sent from the control element 70 of the exposure device to the main controller 40 (S101).

The main controller 40 which has received the EUV radiation interruption signal controls the high voltage pulse generating part 50, stops the discharge between the electrodes 1*a*, 1*b*, interrupts the EUV radiation and afterwards sends an evacuation signal to the gas supply-evacuation unit 20 (S102).

The gas supply-evacuation unit 20 based on the received evacuation signal begins evacuation of the chamber 10 (S103). In doing so, the amount of evacuation per unit of time is set beforehand to an amount at which hydrogen gas and hydrogen radicals which are emitted in a later step from the radical producing parts 32*a*, 32*b* are effectively evacuated.

The main controller 40 sends an EUV focusing mirror movement command to the movement carrier control element 80 (S104).

The movement carrier control element 80 drives the movement carrier 8, moves the EUV focusing mirror 5, for example, to a lower predefined position in FIG. 13 and positions it (S105). The above described predefined position is the position which is set such that, for example, the radical producing parts 32*a*, 32*b* can penetrate into the space between the upper part of the EUV focusing mirror 5 and the debris trap 4.

After completion of positioning, the movement carrier control element 80 sends a positioning termination signal to the main controller (S106).

The main controller 40 which has received the positioning termination signal sends a hydrogen radical production start signal to the drive control element 33 (S107). In doing so, the main controller 40 acquires the result of computing the amount of tin and/or a tin compound which has deposited on the EUV focusing mirror 5 by the layer thickness measurement means 35.

The drive control element 33, based on the received hydrogen radical production start signal from the main controller 40, sends the drive unit 33*c* a drive start signal for starting operation of the drive unit 33*c* such that the hydrogen radical outlet tubes of the radical producing parts 32*a*, 32*b* are positioned at given positions at which the hydrogen radicals emitted by the hydrogen radical outlet tubes are effectively delivered in the area of the EUV focusing mirror 5 in which tin and/or a tin compound has deposited (S108).

The drive unit 33*c* based on the drive start signal drives the drive devices G2, G4 and positions the radical producing parts 32*a*, 32*b* in the above described given positions (S109).

After completion of positioning by the drive unit 33*c*, the drive control element 33 opens the valves V2, V4 and supplies hydrogen gas to the radical producing parts 32*a*, 32*b* from the H₂ gas supply unit 33*d*. At the same time, the drive control element 33 begins operation of a timing means (not shown), for example, of a counter (S110).

Next, based on a counter termination signal which is delivered after a given time has expired by the above described timing means, the drive control element 33 moves the switches S2, S4 which are connected to the heating power source 33*e* into the ON state and supplies power to the filament which is inserted into the reaction chamber of the radical producing parts 32*a*, 32*b* to which the hydrogen gas has been supplied (S111).

At the same time, the drive control element 33 sends a signal for starting operation of the radical producing parts to the main controller 40 (S112). Here, the above described given time means the time with which the hydrogen gas spreads sufficiently within the above described reaction chamber. The timing means is reset after the counter termination signal is sent. At the instant at which filament operation has begun, the formation of hydrogen radicals begins. From the hydrogen radical outlet tubes of the radical producing parts 32*a*, 32*b*, the hydrogen radicals are fed into the area of the EUV focusing mirror 5 at which tin and/or a tin compound has deposited. Furthermore, the main controller 40 has a cleaning time measurement means (not shown) which comprises a counter. After receiving the signal to start the operation of the radical producing parts which was sent in step S112 by the drive control element, counter operation of the cleaning time measurement means is started (S113).

Based on the counter termination signal which is delivered by the cleaning time measurement means after a given time has expired, the main controller 40 sends a hydrogen radical production stop signal to the drive control element 33 (S114). The above described given time here means a time with which tin and/or a tin compound from the location of the EUV focusing mirror 5 on which they have deposited is eliminated. As was described above, the main controller 40 acquires the result of computing the amount of tin and/or a tin compound which has deposited on the EUV focusing mirror by the layer thickness measurement means 35.

On the other hand, the number of hydrogen radicals which have been emitted from the radical producing parts 32*a*, 32*b* is kept constant. The reaction amount of this constant amount of hydrogen radicals with tin and/or a tin compound per unit of time is stored beforehand in the main controller 40. The above described given time for step S114 is on the basis of this reaction amount per unit of time and on the basis of the amount of deposition of tin and/or a tin compound on the EUV focusing mirror 5.

The drive control element 33, after receiving the hydrogen radical production stop signal in step 114, moves the switches S2, S4 into the OFF state and stops the power supply to the filaments of the radical producing parts 32*a*, 32*b* (S115).

Next, the drive control element 33 closes the valves V2, V4 and stops hydrogen gas supply from the H₂ gas supply unit 33*d* to the radical producing parts 32*a*, 32*b* (S116).

Furthermore, by the drive unit 33*c*, the drive control element 33 drives the drive devices G2, G4 and positions the radical producing parts 32*a*, 32*b* such that they are removed to a position at which they do not screen the optical path of the EUV radiation which is incident in the EUV focusing mirror 5 (S117).

After completion of positioning by the drive unit 33*c*, the drive control element 33 sends a signal to terminate operation of the radical producing parts to the main controller 40 (S118).

After receiving the signal to terminate operation of the radical producing parts, the main controller 40 sends an EUV focusing mirror movement command from the drive control element 33 to the movement carrier control element 80 (S119).

The movement carrier control element 80 drives the movement carrier 8, moves the EUV focusing mirror 5 to a given position at which the EUV radiation which has been emitted by the high density and high temperature plasma is focused, and positions it in this position (S120). After completion of positioning, the movement carrier control element 80 sends a positioning termination signal to the main controller 40 (S121).

After receiving the positioning termination signal from the movement carrier control element 80, the main controller 40 sends an evacuation stop signal to the gas supply-evacuation unit 20 (S122).

Based on the received evacuation stop signal, the gas supply-evacuation unit 20 stops evacuation of the chamber 10 (S123). In the case in which EUV radiation generation is then begun, the gas supply unit 20 does not stop evacuation of the chamber 10, but regulates the supply amount of $SnH_4$ gas to the chamber and the evacuation amount of it such that the pressure of the generating part 3 for high density and high temperature plasma is set to a given pressure.

After completion of the step S123, the main controller 40 sends a signal to terminate elimination of tin and/or a tin compounds to the control element 70 of the exposure machine (S124).

When the radical producing parts are moved such that they have approached the EUV focusing mirror, in hydrogen radical treatment in this exemplary embodiment steps S104 to S106 and S119 to S121 are omitted in the above described sequence in the case in which the EUV focusing mirror should remain at the given focusing position.

In this exemplary embodiment, position control of the radical producing parts is possible. Therefore, the radical producing parts can be moved such that they have approached the EUV focusing mirror and the number of hydrogen radicals which have been supplied to the EUV focusing mirror from the radical producing parts can be ensured to an adequate degree.

The above described action is enhanced especially in an interruption of the EUV radiation source device, since the limitation, specifically the positioning to the positions at which the EUV radiation emitted by the high density and high temperature plasma does not screen the optical path which is incident in the EUV focusing mirror, is no longer present.

Furthermore, the arrangement of the device for position control of the EUV focusing mirror has made it possible by regulating the positions of the EUV focusing mirror and the radical producing parts in a suitable manner during an interruption of the EUV radiation source device to react tin and/or a tin compound which have deposited on the surface of the EUV focusing mirror with hydrogen radicals, to form gaseous tin hydride (for example, $SnH_4$) at a high vapor pressure and to evacuate it by the evacuation means.

It has therefore become possible to effectively clean the EUV focusing mirror even in the case of a difficult arrangement of the radical producing parts in the space between the debris trap and the EUV focusing mirror as a result of the limitation by the position of the EUV focusing mirror in the case of focusing the EUV radiation during the interruption of the EUV radiation source device.

This means that, in this exemplary embodiment, by the movement device which the radical producing parts and EUV focusing mirror have, optimum position control of the two to one another is enabled in a discharge and in cleaning.

In this embodiment, a case of a reaction of the tin and/or a tin compound which had deposited on the EUV focusing mirror with hydrogen radicals was described. But the invention is not limited thereto. The debris as a result of tin also deposits, for example, on the debris trap 4 which is located directly underneath the generating part 3 for high density and high temperature plasma, and on the opening areas and the like of the insulating material 2. Therefore, the radical producing parts 31*a*, 31*b*, can also be positioned by a drive of the drive devices G1, G3 by the drive unit 33*c* such that the hydrogen radicals emitted by the radical producing parts 31*a*, 31*b*, are fed into the openings and the like of the debris trap 4 and of the insulating material 2 to a sufficient degree.

(5) Fifth Embodiment

Figure 16:
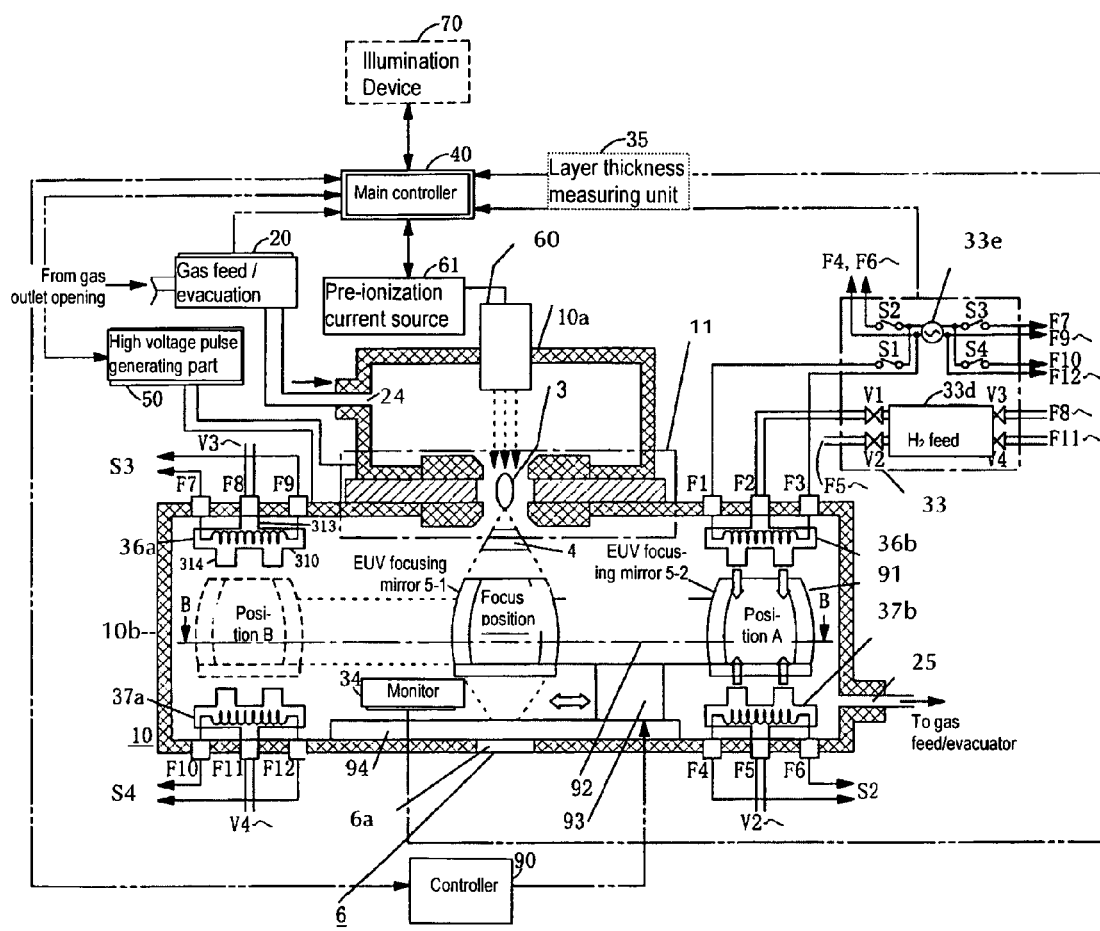
FIG. 16 is a schematic representation of the specific arrangement of a fifth embodiment of the EUV radiation source in accordance with the invention.

FIG. 16 shows the specific arrangement of a fifth exemplary embodiment of the EUV radiation source device into which a hydrogen radical producing means has been installed. Here, as in FIGS. 3 & 5, an EUV radiation source device of the DPP type is shown. The same parts as in FIGS. 3 & 5 are provided with the same reference numbers and are not further described.

The EUV radiation source device in this embodiment has an EUV focusing mirror unit 91 which is formed by coupling two groups of EUV focusing mirrors 5-1, 5-2. This EUV focusing mirror unit 91 is installed in a linearly movable carrier 93 which can be moved back and forth in a one-dimensional direction, and is kept linearly movable.

The EUV radiation source device in this embodiment eliminates tin and tin compounds which have deposited on the other EUV focusing mirror by the hydrogen radicals which are emitted by the radical producing parts when one of the EUV focusing mirrors of the linearly movable EUV focusing mirror unit 91 is located at the position at which the EUV radiation emitted by the high density and high temperature plasma is focused.

Figure 17:
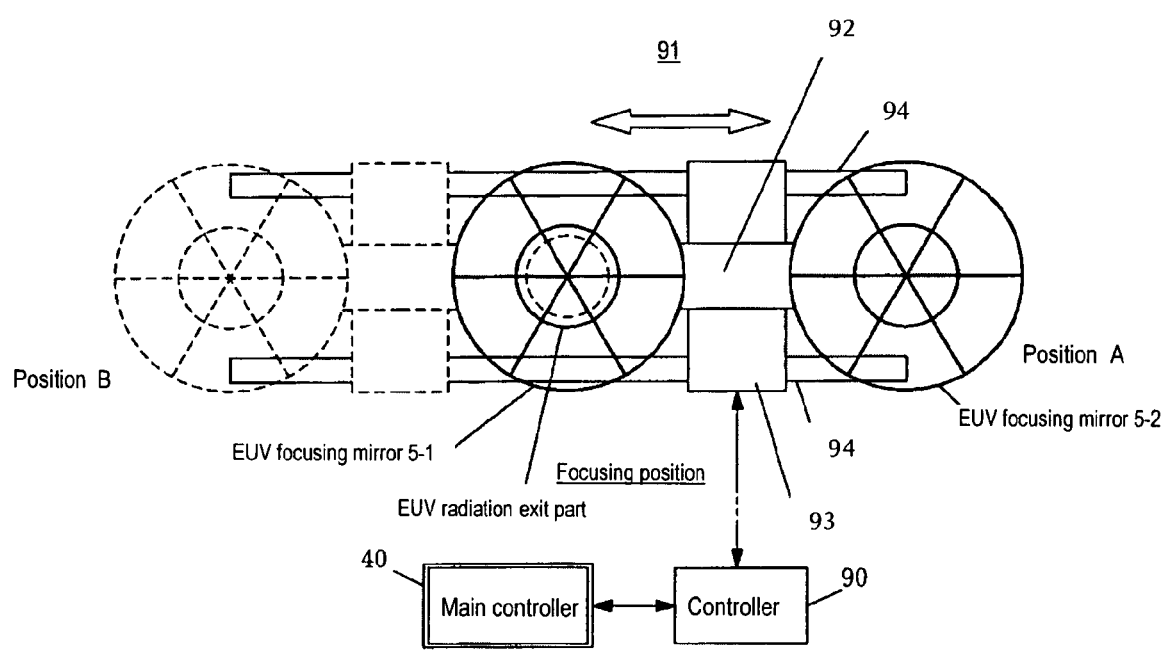
FIG. 17 is a schematic representation of the arrangement of one example of an EUV focusing mirror with a linear motion function which is used in the fifth embodiment.

FIG. 17 is a schematic of the arrangement of one example of the EUV focusing mirror unit which is used in this exemplary embodiment with a linear movement function. It is a cross-sectional view taken along line B-B in FIG. 16.

In FIGS. 16 & 17, the EUV focusing mirror unit 91 has an arrangement in which the two EUV focusing mirrors 5-1, 5-2 are coupled to one another by means of a focusing mirror holding part 92 that is installed on a linearly movable carrier 93 which can be moved back and forth in a one-dimensional direction, i.e., in the direction of the arrow shown in FIGS. 16 & 17. The direction of motion of this carrier 93 is fixed by two rails 94.

The carrier 93 is subjected to position control by a control element 90 for a linearly movable device with a driver for movement. In this embodiment, when the positioning signal which has been sent by the main controller 40 is received, the carrier 93 is driven by the control element 90, by which position control of the EUV focusing mirror unit 91 is carried out.

In FIG. 16, for the EUV focusing mirror unit 91 the EUV focusing mirror 5-1 is located at the focusing position by the main controller 40. In doing so, the position is controlled such that the state in which the EUV focusing mirror 5-2 is located at a position A, and the state in which the EUV focusing mirror 5-2 is located at the focusing position and the EUV focusing mirror 5-1 is located at a position B, are implemented in alternation.

Radical producing parts 36*a*, 36*b*, 37*a*, 37*b* have seal areas as shown in FIG. 7, for example. At a location in the middle area of a flow reactor 310, there is a hydrogen gas feed tube 313. On the two ends of the flow reactors 310 there is a hydrogen radical outlet tube 314 at a respective location. The radical producing parts 36*b*, 37*b*, are mounted in the vessel 10*b* such that, when the EUV focusing mirror 5-2 is being positioned in a position A, the emission direction of the hydrogen radicals which are emitted by the hydrogen radical outlet tubes 314 at the respective two locations of the radical producing parts 36*b*, 37*b*, is opposite the reflection surface of the EUV focusing mirror 5-2. Here, the radical producing part

36b is mounted above the positioned EUV focusing mirror 5-2 and the radical producing part 37b is mounted underneath the positioned EUV focusing mirror 5-2.

Likewise, the radical producing parts 36a, 37a, are mounted in the vessel 10b such that when the EUV focusing mirror 5-1 is being positioned in a position B, the emission direction of the hydrogen radicals which are emitted by the hydrogen radical outlet tubes at the respective two locations of the radical producing parts 36a, 37a, is opposite the reflection surface of the EUV focusing mirror 5-1. Here, the radical producing part 36b is mounted above the positioned EUV focusing mirror 5-1 and the radical producing part 37a is mounted underneath the positioned EUV focusing mirror 5-1.

The respective filament of the radical producing parts 36b, 37b is connected by way of the switches S1, S2 to the heating power source 33e which the drive control element 33 has. The line connection of the respective filament to the heating power source 33e takes place by way of the "field through parts" F1, F3, F4, F6 which are located on the wall of the vessel 10b. The sealing action of the vessel 10b is therefore not adversely affected by line installation.

Likewise, the respective filament of the radical producing parts 36a, 37a, is connected by way of the switches S3, S4, to the heating power source 33e which the drive control element 33 has. The line connection of the respective filament to the heating power source 33e takes place by way of the "field through parts" F7, F9, F10, F12 which are located on the wall of the vessel 10b. The sealing action of the vessel 10b is therefore not adversely affected by line installation.

The radical producing parts 36b, 37b are each connected via valves V1, V2 to the $H_2$ gas supply unit 33d which the drive control element 33 has. The connection of the radical producing parts 36b, 37b to the $H_2$ gas supply unit 33d also takes place as in the above described electrical line installation by way of "field through parts" F2, F5. The sealing action of the vessel 10b is therefore not adversely affected by the pipeline arrangement.

Likewise, the radical producing parts 36a, 37a are each connected via the valves V3, V4 to the $H_2$ gas supply unit 33d which the drive control element 33 has. The connection of the radical producing part 36a, 37a to the $H_2$ gas supply unit 33d also takes place as in the above described electrical line installation by way of "field through parts" F8, F11. The sealing action of the vessel 10b is therefore not adversely affected by the pipeline arrangement.

The supply of hydrogen gas to the radical producing parts 36a, 36b, 37a, 37b is controlled by switching control of the valves V1, V2, V3, V4 by a command signal of the main controller 40. Power is supplied to the radical producing parts 36a, 36b, 37a, 37b likewise by switching control of the switches S1, S2, S3, S4.

Figure 18:
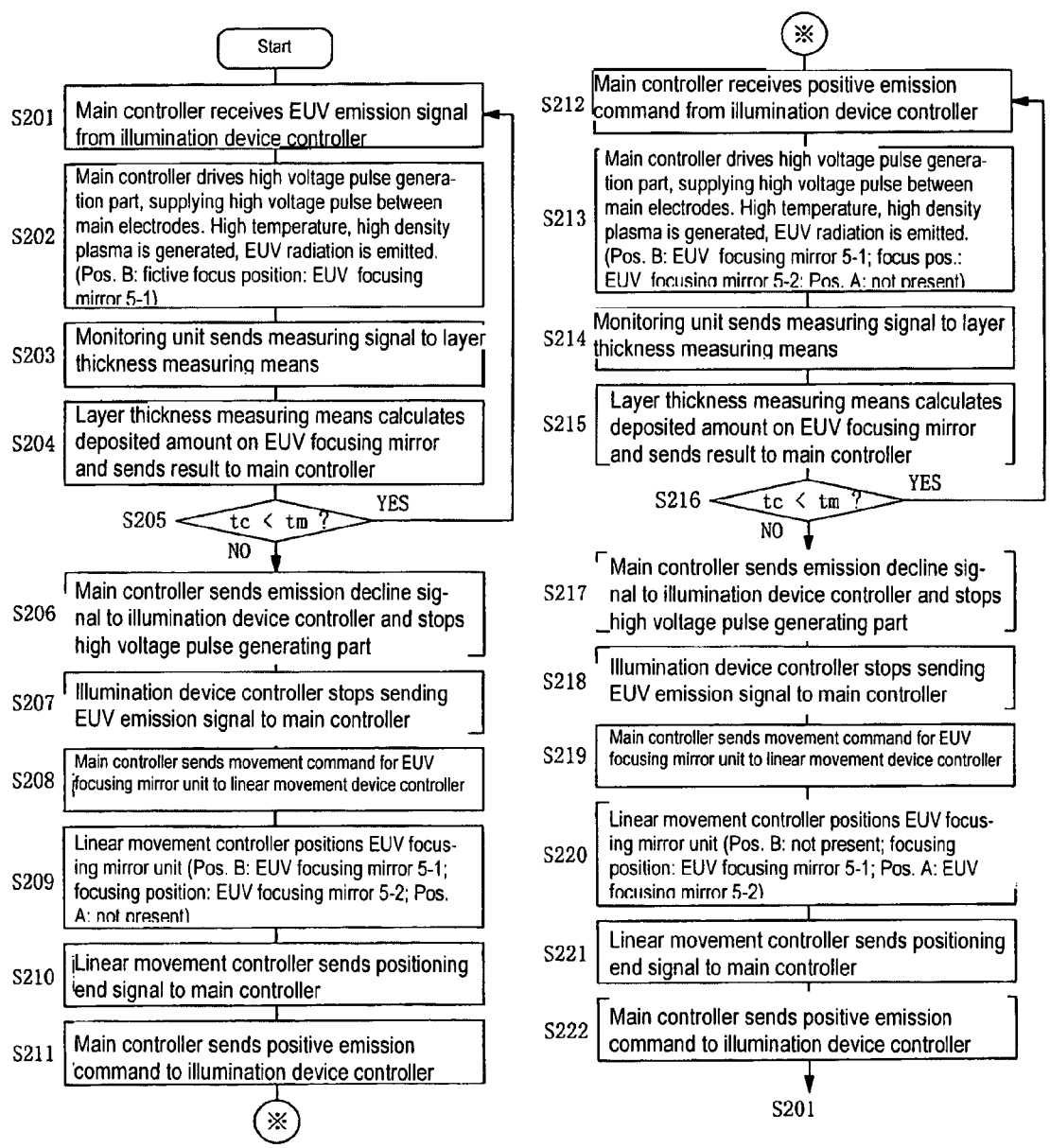
FIG. 18 is a flow chart of one example of the operating sequence of the EUV radiation source device in a fifth embodiment.
Figure 19:
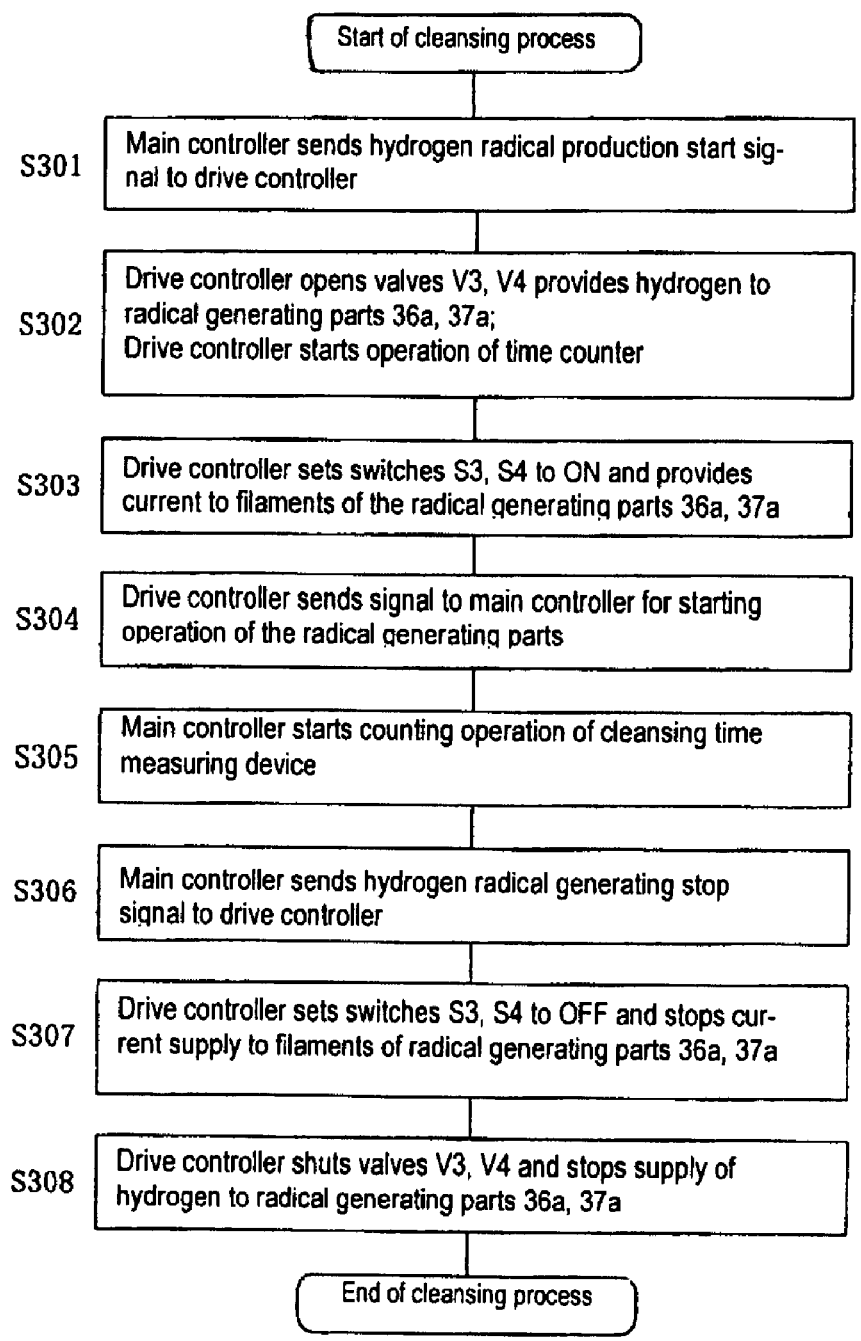
FIG. 19 is a flow chart of one example of cleaning treatment of the focusing mirror with hydrogen radicals.
Figure 20:
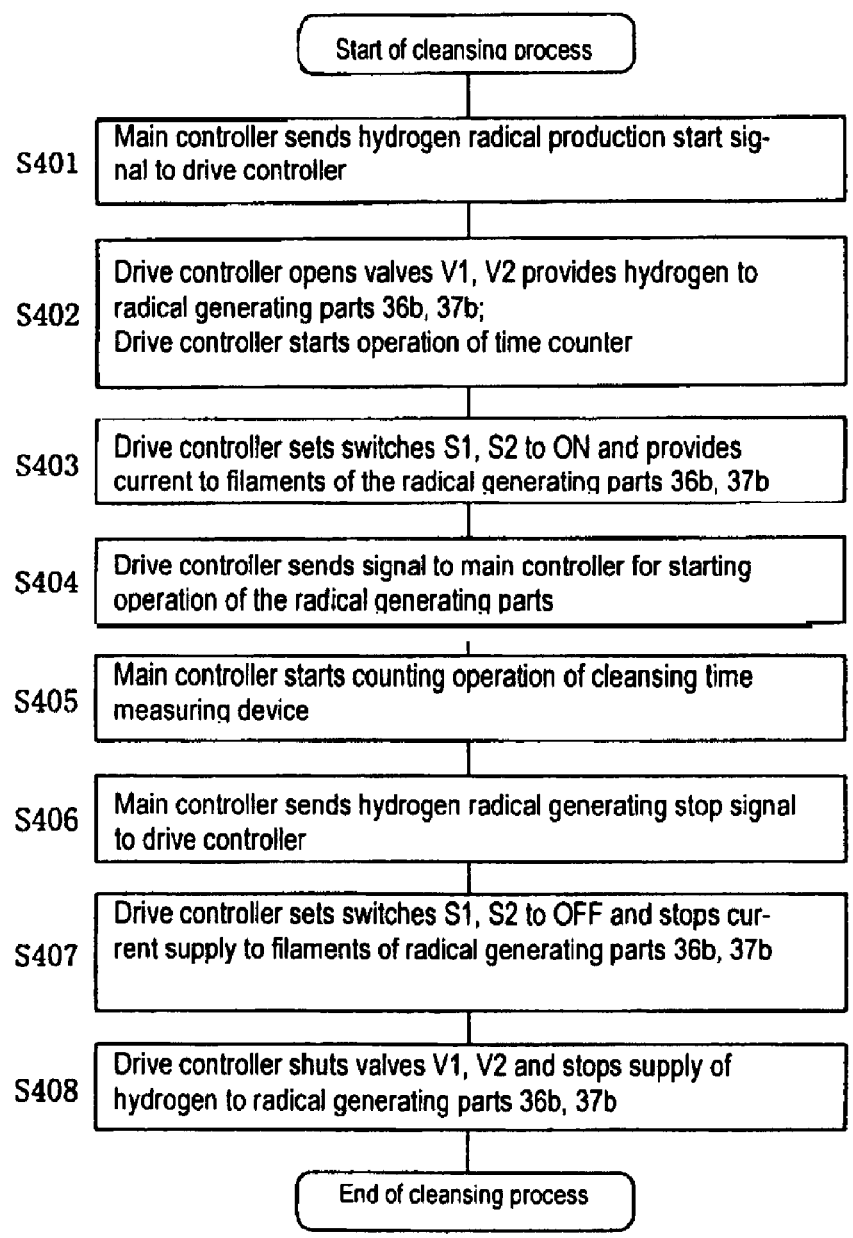
FIG. 20 is a flow chart of another example of the cleaning treatment of the focusing mirror with hydrogen radicals.

FIG. 18 to FIG. 20 are flow charts of an example of the treatment sequence in this embodiment. The operating sequence of the EUV radiation source device according to this embodiment is described first using FIG. 18.

An EUV emission command signal is send to the main controller 40 from the control element 70 of the exposure device (S201).

The main controller 40, which was in the EUV emission command stand-by state, after receiving the EUV emission command signal, drives the high voltage pulse generating part 50, by which a high voltage pulse is applied between the electrodes 1a and 1b. By applying the high voltage pulse between these electrodes, high density and high temperature plasma is formed, and EUV radiation is emitted (S202). In doing so, it is assumed that no tin and/or tin compound deposits, in any case, on the surfaces of the two EUV focusing mirrors 5-1, 5-2. The EUV focusing mirror unit 91 is positioned by the control element 90 for a linearly movable device such that the EUV focusing mirror 5-1 is located at a focus position and the EUV focusing mirror 5-2 is located at a position A.

After EUV emission, the monitor unit 34 sends a determination signal to the layer thickness measurement means 35 (S203). The layer thickness measurement means 35, based on the received determination signal, computes the amount of tin and/or a tin compound which have deposited on the EUV focusing mirror 5-1 and sends the result of the computation to the main controller 40 (S204). The main controller 40 stores the threshold value data (tm) of the allowable amount of deposition of tin and/or a tin compound beforehand.

The main controller 40 which has received the computed data on the amount of deposition in the step S204 from the layer thickness measurement means 35 checks which of the computed data on the amount of deposition (tc) and the above described threshold value data (tm) are larger (S205). When tc<tm as a result of the check, the main controller 40 returns to the EUV emission command stand-by state, i.e. back to the step S201. EUV emission takes place by repetitions of operation of steps S201 to S205 and the EUV radiation which has been focused by the EUV focusing mirror 5-1 emerges from the EUV radiation exit part 6.

When tc≧tm is the result of the check, the main controller 40 sends an emission command rejection signal to the control element 70 of the exposure device, and moreover, stops operation of the high voltage pulse generation part (S206).

The control element 70 of the exposure device which has received the emission command rejection signal from the main controller 40 stops transmission of the EUV emission command signal to the main controller 40 (S207).

The main controller 40 sends an EUV focusing mirror unit movement command to the control element 90 for a linearly movable device (S208).

The control element 90 for a linearly movable device drives the linearly movable carrier 93, moves the EUV focusing mirror unit 91 to the left in FIG. 16, and positions it such that the EUV focusing mirror 5-2 is located at a focus position and the EUV focusing mirror 5-1 is located at a position B (S209).

After completion of positioning, the control element 90 for a linearly movable device sends a positioning termination signal to the main controller 40 (S210). When the EUV focusing mirror 5-1 is positioned in the position B, this focusing mirror 5-1 is cleaned in the manner described below using FIG. 19.

On the other hand, the main controller 40 sends an emission command authorization signal to the control element 70 of the exposure machine after receiving the positioning termination signal in the step S210 (S211).

An EUV emission command signal is sent from the control element 70 of the exposure machine to the main controller 40 (S212).

The main controller 40, which was in the EUV emission command stand-by state, after receiving the EUV emission command signal drives the high voltage pulse generating part 50, by which a high voltage pulse is applied between the electrodes 1a and 1b. By applying the high voltage pulse between these electrodes, high density and high temperature plasma is formed and EUV radiation is emitted (S213).

After EUV emission, the monitor unit 34 sends a determination signal to the layer thickness measurement means 35 (S214). The layer thickness measurement means 35, based on the received determination signal, computes the amount of tin and/or a tin compound which have deposited on the EUV focusing mirror 5-2 and sends the result of the computation to the main controller 40 (S215). The main controller 40 stores the threshold value data (tm) of the allowable amount of deposition of tin and/or a tin compound beforehand, as was described above.

The main controller 40 which, has received the computed data on the amount of deposition in the step S215 from the layer thickness measurement means 35 checks which of the computed data on the amount of deposition (tc) and the above described threshold value data (tm) are larger (S216). When tc<tm is the result of the check, the main controller 40 returns to the EUV emission command stand-by state, i.e. back to the step S212. EUV emission takes place by repetitions of the operation of steps S212 to S216 and the EUV radiation which has been focused by the EUV focusing mirror 5-2 emerges from the EUV radiation exit part 6.

When tc≧tm is the result of the check, the main controller 40 sends an emission command rejection signal to the control element 70 of the exposure device, and moreover, stops operation of the high voltage pulse generation part (S217).

The control element 70 of the exposure device which has received the emission command rejection signal from the main controller 40 stops transmission of the EUV emission command signal to the main controller 40 (S218).

The main controller 40 sends a movement command for the EUV focusing mirror unit 91 to the control element 90 for a linearly movable device (S219).

The control element 90 for a linearly movable device drives the linearly movable carrier 93, moves the EUV focusing mirror unit 91 to the right in FIG. 16 and positions it such that the EUV focusing mirror 5-1 is located in a focusing position and the EUV focusing mirror 5-2 is located in the position A (S220). The EUV focusing mirror 5-1 has already been completely cleaned by the treatment shown in FIG. 19. When the EUV focusing mirror 5-2 is positioned in the above described position A, this focusing mirror 5-2 is cleaned in the manner described below using FIG. 20.

After completion of positioning, the control element 90 for the linearly movable device sends a positioning termination signal to the main controller (S221).

After receiving the positioning termination signal in the step S221, the main controller 40 sends an emission command authorization signal to the control element 70 of the exposure device (S222). Afterwards, the operation of steps S201 to S222 is repeated.

The above described process steps are used for a case in which the time between the state in which there is no deposition of tin and/or a tin compound on the EUV focusing mirror, and the state in which the amount of deposition of tin and/or a tin compound has exceeded the allowable amount of deposition is longer than the time up to elimination of tin and/or a tin compound which have deposited on the EUV focusing mirror in the sequence described below by hydrogen radicals.

In the case in which the time between the state in which there is no deposition of tin and/or a tin compound on the EUV focusing mirror, and the state in which the amount of deposition of tin and/or a tin compound has exceeded the allowable amount of deposition is shorter than the time up to elimination of tin and/or a tin compound which have deposited on the EUV focusing mirror by the hydrogen radicals, a predefined waiting time must be taken between the process steps S207 and S208 and between the steps S218 and S219.

Cleaning treatment of the focusing mirrors 5-1, 5-2 by the hydrogen radicals in this embodiment is described below using FIGS. 19 & 20.

As was described above, in the step S210 shown in FIG. 18, when the EUV focusing mirror 5-1 is being positioned at the above described position B, the main controller 40 receives the positioning termination signal and passes into the step S211. Parallel to this, the EUV focusing mirror 5-1 is cleaned in the manner which is shown in FIG. 19.

This means that the main controller 40 which has received the positioning termination signal in the step S210 which is shown in FIG. 18 sends a hydrogen radical production start signal to the drive control element 33 (S301).

The drive control element which has received the hydrogen radical production start signal, moves the valves V3, V4 into the open state and supplies hydrogen gas to the radical producing parts 36a, 37b from the $H_2$ gas supply unit 33d. At the same time, the drive control element 33 begins operation of a timing means which is not shown in the drawings, for example of a counter (S302).

Next, based on a counter termination signal which is delivered by the above described timing means after a given time has expired, the drive control element 33 moves the switches S3, S4, which are connected to the heating power source 33e into the ON state and supplies power to the filament which is inserted into the reaction chamber of the radical producing parts 36a, 37a to which the hydrogen gas has been supplied (S303).

At the same time, the drive control element 33 sends a signal to start operation of the radical producing parts to the main controller 40 (S304). Here, the above described given time means the time with which the hydrogen gas spreads sufficiently within the above described reaction chamber. The timing means is reset after the counter termination signal is sent. At the instant at which filament operation has begun, the formation of hydrogen radicals begins. From the hydrogen radical outlet tubes of the radical producing parts 36a, 37a, the hydrogen radicals are delivered to the area of the EUV focusing mirror 5-1 in which tin and/or a tin compound have deposited. The main controller 40 furthermore has a cleaning time measurement means (not shown) and which comprises, for example, a counter. After receiving the signal to start the operation of the radical producing parts which was sent in the step S304 by the drive control element 33, counter operation of the cleaning time measurement means is started (S305).

Based on the counter termination signal which is delivered by the cleaning time measurement means after a given time has expired, the main controller 40 sends a hydrogen radical production stop signal to the drive control element 33 (S306). The above described given time here means a time with which tin and/or a tin compound from the area of the EUV focusing mirror 5-1 in which they have deposited is eliminated. As was described above, the main controller 40 stores threshold value data (tm). The amount of tin and/or tin compounds which have deposited on the EUV focusing mirror 5-1 agrees essentially with tm. On the other hand, the number of hydrogen radicals which have been emitted from the radical producing parts 36a, 37a is kept constant. The reaction amount of this constant number of hydrogen radicals with tin and/or a tin compound per unit of time is stored beforehand in the main controller 40. The main controller determines the above described given time for the step S306 on the basis of this reaction amount per unit of time and on the basis of the amount of deposition of tin and/or a tin compound on the EUV focusing mirror 5-1.

After receiving the hydrogen radical production stop signal in the step 306, the drive control element 33 moves the switches S3, S4 into the OFF state and stops the power supply to the filaments of the radical producing parts 36a, 37a (S307).

Next, the drive control element 33 closes the valves V3, V4 and stops the hydrogen gas supply from the $H_2$ gas supply unit 33d to the radical producing parts 36a, 37a (S308).

The cleaning treatment of the focusing mirror 5-2 in the radical producing parts 36b, 37b also takes place in the same way as in steps S301 to S308. This means that, in the step S221 shown in FIG. 18, when the EUV focusing mirror 5-2 is being positioned at the above described position A, the main controller 40 receives the positioning termination signal and passes into treatment in the step S222, as was described above. Parallel to this, the EUV focusing mirror 5-2 is cleaned in the manner which is shown in FIG. 21.

The sequence of the cleaning treatment (S401 to S408) of the focusing mirror 5-2 is described below.

A hydrogen radical generation start signal is sent to the drive control element 33 from the main controller 40 which has received the positioning termination signal in the step S222 as shown in FIG. 18 (S401).

The drive control element 33 moves the valves V1, V2 into the open state and supplies hydrogen gas to the radical producing parts 36b, 37b. At the same time, the drive control element 33 begins operation of a timing means (not shown) (S402).

Based on a counter termination signal which is delivered by the timing means, the drive control element 33 moves the switches S1, S2 which are connected to the heating power source 33e into the ON state and supplies power to the filaments of the radical producing parts 36b, 37b (S403).

At the same time, the drive control element 33 sends a hydrogen radical production start signal to the main controller 40 (S404). At the instant at which filament operation has begun, formation of hydrogen radicals starts. From the hydrogen radical outlet tubes of the radical producing parts 36b, 37b, the hydrogen radicals are delivered to the area of the EUV focusing mirror 5-2 in which tin and/or a tin compound have deposited. After receiving the hydrogen radical production start signal in step S404, counter operation of the cleaning time measurement means is started (S405).

Based on the counter termination signal which is delivered by the cleaning time measurement means, the main controller 40 sends a hydrogen radical production stop signal to the drive control element 33 (S406).

The drive control element 33 after receiving the hydrogen radical production stop signal in the step S406 moves the switches S1, S2 into the OFF state and stops the power supply to the filaments of the radical producing parts 36b, 37b (S407).

Next, the drive control element 33 closes the valves V1, V2 and stops the hydrogen gas supply from the $H_2$ gas supply unit 33d to the radical producing parts 36b, 37b (S408).

In this embodiment, the EUV radiation source device has an EUV focusing mirror unit which is formed by coupling two groups of EUV focusing mirrors and which can be moved back and forth in a one-dimensional direction, as was described above. When one of the EUV focusing mirrors is located at the position at which the EUV radiation which has been emitted by the high density and high temperature plasma is focused, this EUV radiation source device makes it possible to eliminate tin and/or a tin compound which have deposited on the other EUV focusing mirror by the hydrogen plasma which has been emitted by the radical producing parts.

This means that simultaneously with focusing of the EUV radiation using an EUV focusing mirror, tin and/or a tin compound which have deposited on the other EUV focusing mirror can be eliminated by the reaction with the hydrogen radicals.

Therefore, it is possible to replace the already cleaned EUV focusing mirror when the amount of deposition of debris on the EUV focusing mirrors which are being monitored by the monitor unit and the layer thickness measurement means has exceeded the allowable range. Therefore the duration of the discharge interruption by cleaning, i.e., the stopping time of the device, can be shortened and the operating capacity of the system increased.

The device shown in FIGS. 16 & 17 for linear movement in a one-dimensional direction can be used for the above described EUV focusing mirror replacement device. However, a rotary movement device (not shown) can also be used. In this case, the following measure yields the advantages that the radical producing parts 36a, 37a are no longer necessary, that a smaller device is obtained and that the arrangement is simplified.

For example, in FIG. 16, the axis of rotation of the EUV focusing mirror unit 90 is located in the position which is equally distant from the center axis of the EUV focusing mirror 5-1 and from the center axis of the EUV focusing mirror 5-2.

By turning this axis of rotation, the EUV focusing mirrors 5-1 and 5-2 are moved to the focus position or to the cleaning position (position A in FIG. 16).

In this embodiment, as in the first embodiment, furthermore there can be hydrogen radical producing parts 31a, 31b, between the debris trap and the EUV focusing mirrors such that the outlet flow which contains the debris crosses the debris emission direction. In this case the hydrogen radical parts 31a, 31b, eliminate some of the debris as a result of the radiating fuel tin before reaching the EUV focusing mirror, by which the frequency of driving the above described EUV focusing mirror unit can be reduced.

The EUV radiation source device in accordance with the invention is not limited to the above described embodiments, but allows different versions.

For example, in the above described different embodiments, the emission direction of the hydrogen radicals which have been emitted by the radical producing parts can also be directed against the openings of the debris trap 4 and of the insulating material 2. Since debris as a result of tin also deposits on the debris trap 4 which is located directly underneath the generating part 3 for high density and high temperature plasma, on the openings of the insulating material 2 and the like, this debris can be effectively eliminated.

In the above described embodiments 1 to 5, an EUV radiation source device of the DPP type was shown. However, it goes without saying that the EUV radiation source device of the LPP type shown in FIG. 4 can also be used here.

What is claimed is:

1. Extreme UV radiation source device, comprising:
   a vessel for forming high density and high temperature plasma;
   a raw material supply means which supplies a raw material which contains at least one of tin and a tin compound to the vessel as an extreme UV radiating fuel;
   a heating/excitation means for heating and exciting the raw material supplied to the vessel to produce high density and high temperature plasma;
   an evacuation means which is connected to the vessel;
   an exit part for extreme UV radiation from which the extreme UV radiation which has been emitted by the high density and high temperature plasma emerges, and
   a means for feeding hydrogen radicals provided in the vessel, wherein said means for feeding hydrogen radicals includes a radical producing part which is arranged such that the emission direction of the hydrogen radicals which have been emitted by the radical producing part crosses an outlet flow containing debris including tin and/or a tin compound which is formed in the extreme UV radiation source device.

2. Extreme UV radiation source device as claimed in claim 1, further comprising a focusing mirror disposed in an area of an optical path defined between a part where high density and high temperature plasma is formed and an exit part for extreme UV radiation and wherein the means for feeding hydrogen radicals supplies hydrogen radicals to an area between a reflection surface of the focusing mirror and an area in which the high density and high temperature plasma is formed.

3. Process for eliminating debris which forms in an extreme UV radiation source device, comprising the steps of:
  supplying a raw material which contains at least one of tin and a tin compound to a vessel of an extreme UV radiation source device as an extreme UV radiation radiating fuel for forming a high density and high temperature plasma;
  producing a high density and high temperature plasma by heating/excitation of the raw material supplied to the vessel, and
  supplying hydrogen radicals to debris which forms in said vessel of the extreme UV radiation source device and that contains at least one of tin and a tin compound for eliminating said debris,
  wherein a hydrogen radical producing part for supplying hydrogen radicals emits hydrogen radicals in such a way that said radicals cross an outlet flow which contains debris including tin and/or a tin compound.

* * * * *